US009511552B2

(12) United States Patent
Toriyama et al.

(10) Patent No.: US 9,511,552 B2
(45) Date of Patent: Dec. 6, 2016

(54) MANUFACTURING METHOD FOR OPTICAL SUBSTRATE USING FILM SHAPED MOLD, MANUFACTURING DEVICE, AND OPTICAL SUBSTRATE OBTAINED THEREBY

(71) Applicant: JX NIPPON OIL & ENERGY CORPORATION, Tokyo (JP)

(72) Inventors: Shigetaka Toriyama, Atsugi (JP); Suzushi Nishimura, Yokohama (JP); Naoto Kozasa, Yokohama (JP); Madoka Takahashi, Tokyo (JP)

(73) Assignee: JX NIPPON OIL & ENERGY CORPORATION, Tokyo (JP)

( * ) Notice: Subject to any disclaimer, the term of this patent is extended or adjusted under 35 U.S.C. 154(b) by 0 days.

(21) Appl. No.: 14/674,661

(22) Filed: Mar. 31, 2015

(65) Prior Publication Data
US 2015/0202829 A1    Jul. 23, 2015

Related U.S. Application Data

(63) Continuation of application No. PCT/JP2013/076791, filed on Oct. 2, 2013.

(30) Foreign Application Priority Data

Oct. 5, 2012 (JP) ................. 2012-223103

(51) Int. Cl.
*B29D 11/00* (2006.01)
*B29C 59/04* (2006.01)
(Continued)

(52) U.S. Cl.
CPC ......... *B29D 11/0073* (2013.01); *B29C 59/046* (2013.01); *B29D 11/00326* (2013.01);
(Continued)

(58) Field of Classification Search
None
See application file for complete search history.

(56) References Cited

U.S. PATENT DOCUMENTS 4,879,967 A    11/1989 Sengoku
2008/0268203 A1    10/2008 Blenkhorn
(Continued)

FOREIGN PATENT DOCUMENTS

CA    2886852 A1    4/2014
CN    101360689 A    2/2009
(Continued)

OTHER PUBLICATIONS

Nov. 11, 2014 Notice of Reasons for Rejection issued in Japanese Patent Application No. 2014-538939.
(Continued)

*Primary Examiner* — Nathan T Leong
(74) *Attorney, Agent, or Firm* — Oliff PLC

(57) ABSTRACT

A method for producing an optical substrate includes: a step of preparing a long film-shaped mold having a concave-convex pattern surface having a concave-convex pattern; a step of forming a coating film made of a sol-gel material on the concave-convex pattern surface of the film-shaped mold; a step of adhering the coating film, which is formed on the concave-convex pattern surface of the film-shaped mold, to a substrate by arranging the concave-convex pattern surface of the film-shaped mold on which the coating film made of the sol-gel material is formed to face the substrate and by pressing a pressing roll against a surface of the film-shaped mold on a side opposite to the concave-convex pattern surface; a step of releasing the film-shaped mold from the coating film; and a step of curing the coating film adhered to the substrate.

13 Claims, 11 Drawing Sheets

(51) Int. Cl.
  *G02B 5/02* (2006.01)
  *G02B 5/18* (2006.01)
  *G02B 1/12* (2006.01)
  *H01L 51/52* (2006.01)
  *B29L 11/00* (2006.01)

(52) U.S. Cl.
  CPC .. *B29D 11/00769* (2013.01); *B29D 11/00798* (2013.01); *G02B 1/12* (2013.01); *G02B 5/021* (2013.01); *G02B 5/0215* (2013.01); *G02B 5/0268* (2013.01); *G02B 5/1852* (2013.01); *B29L 2011/00* (2013.01); *H01L 51/5262* (2013.01); *Y10T 428/24529* (2015.01)

(56) References Cited

U.S. PATENT DOCUMENTS

| | | | |
|---|---|---|---|
| 2009/0073566 A1 | 3/2009 | Katsumoto et al. | |
| 2009/0162623 A1* | 6/2009 | Foresti | B29C 59/046 428/210 |
| 2011/0186712 A1 | 8/2011 | Blenkhorn et al. | |
| 2011/0278548 A1* | 11/2011 | Takezoe | B29D 11/00365 257/40 |
| 2012/0132897 A1 | 5/2012 | Seki et al. | |
| 2012/0133077 A1 | 5/2012 | Mizawa et al. | |
| 2012/0301569 A1 | 11/2012 | Hasegawa et al. | |
| 2013/0299796 A1 | 11/2013 | Masuyama et al. | |

FOREIGN PATENT DOCUMENTS

| | | |
|---|---|---|
| JP | 2006-236748 A | 9/2006 |
| JP | 2010-525968 A | 7/2010 |
| KP | 1989-0007618 | 6/1989 |
| KR | 10-2012-0046743 A | 5/2012 |
| WO | 2011/007878 A1 | 1/2011 |
| WO | 2011/089836 A1 | 7/2011 |
| WO | 2012/096368 A1 | 7/2012 |

OTHER PUBLICATIONS

Mar. 11, 2016 Office Action issued in Chinese Application No. 201380052116.3.
Nov. 26, 2013 Written Opinion issued in International Application No. PCT/JP2013/076791.
Nov. 26 International Search Report issued in International Patent Application No. PCT/JP2013/076791.
Nov. 4, 2014 Office Action issued in Japanese Patant Application No. 2014-538939.
Apr. 29, 2016 Office Action issued in Korean Application No. 10-2015-7007412.
May 17, 2016 extended European Search Report issued in Application No. 13843680.3.
Aug. 12, 2016 Office Action issued in Canadian Patent Application No. 2886852.

\* cited by examiner

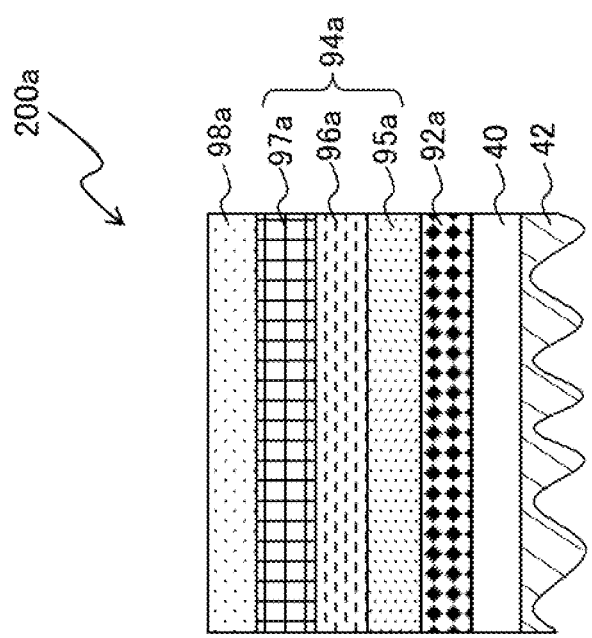

MANUFACTURING METHOD FOR OPTICAL SUBSTRATE USING FILM SHAPED MOLD, MANUFACTURING DEVICE, AND OPTICAL SUBSTRATE OBTAINED THEREBY

CROSS REFERENCE TO RELATED APPLICATION

This application is a continuation application of International Patent Application No. PCT/JP2013/076791 filed on Oct. 2, 2013 claiming the benefit of priority of Japanese Patent Application No. 2012-223103 filed on Oct. 5, 2012. The contents of International Patent Application No. PCT/JP2013/076791 and Japanese Patent Application No. 2012-223103 are incorporated herein by reference in their entities.

BACKGROUND OF THE INVENTION

Field of the Invention

The present invention relates to a producing method for producing an optical substrate having a minute or fine pattern for scattering or diffracting light, by using a long film-shaped mold (elongated or long-length film-shaped mold); and an apparatus performing the producing method.

Description of the Related Art

The lithography method is known as a method for forming a fine pattern (minute pattern) such as a semiconductor integrated circuit. The resolution of a pattern formed by the lithography method depends on the wavelength of a light source, the numerical aperture of an optical system, etc., and a shorter wavelength light source is desired so as to respond to the demand for miniaturized devices in the recent years. Any short wavelength light source is, however, expensive and is not easily developed, and any optical material allowing such short wavelength light passing therethrough needs to be developed, as well. Further, a large sized optical element is required for producing a pattern with a large area by means of the conventional lithography method, which is difficult both technically and economically. Therefore, a new method for forming a desired pattern having a large area has been considered.

The nano-imprint method is known as a method for forming a fine pattern without using any conventional lithography apparatus. The nano-imprint method is a technique capable of transferring a pattern in nano-meter order by sandwiching a resin between a mold (die) and a substrate. As the nano-imprint method, the thermal nano-imprint method, the photo nano-imprint method, etc. have been studied depending on materials to be used. Among the above-described methods, the photo nano-imprint method is composed of the following four steps of: (i) coating with a resin layer (application of a resin layer), (ii) pressing with a mold, (iii) photo-curing and (iv) releasing of the mold (mold-releasing). Thus, the photo nano-imprint method is excellent in that the nano-sized processing can be realized with such a simple process. In particular, since a photo-curable resin curable by being irradiated with light is used as the resin layer, a period of time required for a pattern transfer step is short and thus a high throughput can be expected. Accordingly, the nano-imprint method is expected to be practiced not only in the field of semiconductor device but also in many fields such as optical members like organic EL element, LED, etc.; MEMS; biochips; and the like.

For example, in the organic EL element (organic light emitting diode), a hole injected from a hole injecting layer and an electron injected from an electron injecting layer are each transported to a light emitting layer, then the hole and electron are recombined on an organic molecule in the light emitting layer to excite the organic molecule, thereby emitting light. Therefore, in a case that the organic EL element is used as a display device and/or an illumination device, the light from the light emitting layer is required to be efficiently extracted from the surface of the organic EL element. In order to meet this demand, it is known from Japanese Patent Application Laid-open No. 2006-236748 that a diffraction-grating substrate is provided on a light extraction surface of the organic EL element.

In order to produce a concave-convex pattern (concavity and convexity pattern) of a diffraction grating substrate for an organic EL element, the applicant of the present invention discloses a method in PCT International Publication No. WO2011/007878A1, the method including: applying a solution, obtained by dissolving a block copolymer satisfying a predetermined condition into a solvent, on a base member, and forming a micro phase separation structure of the block copolymer by using a self-organizing phenomenon (self-assembly phenomenon) of the block copolymer, so as to obtain a master block (metal substrate) having a fine and irregular concave-convex pattern formed therein. After obtaining a transferred pattern as a mold by dripping a mixture of a silicon-based polymer and a curing agent onto the obtained master block and then by performing curing therefor, a glass substrate coated with a curable resin is pressed against the transferred pattern and the curable resin is cured by irradiation with ultraviolet rays. By doing so, a diffraction grating in which the transferred pattern is duplicated is produced. Further, by stacking a transparent electrode, an organic layer, and a metal electrode on the diffraction grating, an organic EL element can be obtained.

However, in order to mass-produce the above-mentioned diffraction grating for the organic EL element, it is necessary to efficiently perform the pattern transfer onto a material such as a curable resin by using the transferred pattern as the mold.

Thus, there is a demand for a transfer process and a transfer apparatus which are suitable for mass-producing optical substrate, such as the diffraction-grating substrate, etc., usable for the organic EL element, etc., by using the nano-imprint method and with high throughput.

The photo-curable resin as described above generally has low heat resistance, and is decomposed and/or generate any yellowing at a high temperature. Thus, there is fear that a film having the minute pattern might be disintegrated in a case that any high-temperature treatment is included in a subsequent step. Further, the photo-curable resin has a low adhesion property to a glass substrate. Furthermore, in a case that the resin layer to which the pattern has been transferred is used for an element such as the organic EL element, there is fear that any impurity might be eluted from the resin layer to thereby adversely affect the element. Therefore, in order to mass-produce the optical substrate such as the diffracting-grating substrate for the organic EL element with high throughput by using the nano-imprint method, the material for forming the concave-convex pattern on the glass substrate and/or the material for the mold are also required to be optimized.

In view of the above situation, an object of the present invention is to provide a novel producing method and producing apparatus capable of mass-producing, with a high throughput, an optical substrate provided with a minute or fine concave-convex pattern which has a high adhesion property to the substrate, heat resistance, and weather resistance; and to provide a novel optical substrate obtained by the novel producing method and producing apparatus.

SUMMARY OF THE INVENTION

According to a first aspect of the present invention, there is provided a method for producing an optical substrate having a concave-convex pattern, the method characterized by including:

a step of preparing a long film-shaped mold having a concave-convex pattern surface having the concave-convex pattern.

a step of forming a coating film made of a sol-gel material on the concave-convex pattern surface of the long film-shaped mold;

a step of adhering the coating film, which is formed on the concave-convex pattern surface of the long film-shaped mold, to a substrate by arranging the concave-convex pattern surface of the long film-shaped mold on which the coating film made of the sol-gel material is formed to face the substrate and by pressing a pressing roll against a surface of the long film-shaped mold on a side opposite to the concave-convex pattern surface;

a step of releasing the long film-shaped mold from the coating film; and a step of curing the coating film adhered to the substrate.

In the method for producing the optical substrate, the step of preparing the long film-shaped mold may include:

coating a long film-shaped base member with a concave-convex forming material;

performing a roll transfer of the concave-convex pattern to the concave-convex forming material by pressing a transfer roll having the concave-convex pattern against the concave-convex forming material with which the long film-shaped base member has been coated, while rotating the transfer roll; and curing the concave-convex forming material, to which the concave-convex pattern has been transferred by the roll transfer, so as to obtain the long film-shaped mold in a roll shape.

Further, the long film-shaped base member having the cured concave-convex forming material may be taken up by a film take-up roll to be wound around the film take-up roll; and/or the concave-convex pattern of the transfer roll may be transferred while the long film-shaped base member is being transported by using a film feeding roll configured to feed the long film-shaped base member and a film take-up roll configured to take up the long film-shaped base member to wind the long film-shaped base member around. In any of these cases, the long film-shaped mold in the roll shape wound around the film take-up roll may be fed to and moved toward the pressing roll. Further, the released long film-shaped mold may be taken up by a mold take-up roll to be wound around the mold take-up roll.

In the method for producing the optical substrate, the pressing roll may be pressed against the surface of the long film-shaped mold on the side opposite to the concave-convex pattern surface while the coating film formed on the concave-convex pattern surface is being heated. By doing so, the pre-baking of the sol-gel material is performed simultaneously with the pressing, which makes it possible to form the concave-convex pattern reliably and to facilitate the releasing of the concave-convex pattern surface from the coating film after the pressing. Further, it is possible to further facilitate the releasing of the concave-convex pattern surface from the coating film after the pressing by heating the pressed coating film between the step of adhering the coating film to the substrate and the step of releasing the long film-shaped mold from the coating film, or in the step of releasing the long film-shaped mold from the coating film.

In the method for producing the optical substrate, the long film-shaped mold may be fed underneath the pressing roll while the long film-shaped mold is being continuously coated with the sol-gel material, and a plurality of pieces of the substrate may be transported to the pressing roll and the coating film formed on the concave-convex pattern surface of the long film-shaped mold is pressed successively against the plurality of substrates with the pressing roll. By using the long film-shaped mold, such a continuous processing of the substrates can be realized, which in turn makes it possible to improve the throughput of the production of the substrate. The length of the long film-shaped mold can be adjusted to a length sufficient to produce the optical substrate in an amount corresponding to one lot, for example, several hundreds to several thousands of pieces of the optical substrate. For example, the length of the long film-shaped mold can be adjusted in a range of several hundreds of meters to several thousands of meters.

The concave-convex pattern of the long film-shaped mold used in the method for producing the optical substrate may be an irregular concave-convex pattern; an average pitch of concavities and convexities of the irregular concave-convex pattern may be in a range of 10) nm to 1,500 nm; and an average value of depth distribution of the concavities and convexities may be in a range of 20 nm to 200 nm. The substrate may be a glass substrate. Since the sol-gel material is composed of an inorganic material, the refractive index of the sol-gel material is similar to that of the glass substrate, which is preferred. The sol-gel material may contain a silica precursor.

According to a second aspect of the present invention, there is provided a method for producing an organic EL element, the method characterized by including:

producing a diffraction grating substrate, which has a concave-convex surface as an optical substrate, by using the method of producing the optical substrate of the first aspect; and stacking a transparent electrode, an organic layer, and a metal electrode successively on the concave-convex surface of the optical substrate or on a surface of the optical substrate on a side opposite to the concave-convex surface, so as to produce the organic EL element.

According to a third aspect of the present invention, there is provided an apparatus for producing an optical substrate, the apparatus characterized by including:

a coating film-forming section which forms a coating film made of a sol-gel material on a concave-convex pattern surface of a long film-shaped mold having a concave-convex pattern;

a substrate transporting section which transports a substrate to a predetermined position;

a mold transporting section which includes a mold feeding roll configured to feed the long film-shaped mold, and which transports the long film-shaped mold to the predetermined position by feeding the long film-shaped mold continuously from the feeding roll to the predetermined position; and a pressing roll arranged at the predetermined position and configured to press a portion, of the coating film formed on the concave-convex pattern surface of the long film-shaped mold which is fed by the mold transporting section to the predetermined position, against the substrate which is transported by the substrate transporting section to the predetermined position.

The apparatus for producing the optical substrate may further include a releasing roll configured to facilitate releasing of the concave-convex pattern surface of the long film-shaped mold from the coating film, the portion of the long film-shaped mold having been pressed against the substrate by the pressing roll.

In the apparatus for producing the optical substrate, the mold transporting section may further include a mold take-up roll which takes up the long film-shaped mold to wind the long film-shaped mold around. The mold transporting section may transport the long film-shaped mold to the predetermined position by continuously feeding the long film-shaped mold from the mold feeding roll and by taking up the long film-shaped mold by the mold take-up roll to wind the long film-shaped mold around the mold take-up roll.

The apparatus for producing the optical substrate may further includes a cutter configured to cut a portion of the long film-shaped mold pressed against the substrate by the pressing roll.

The apparatus for producing the optical substrate may further include a first heating means for heating the coating film, the portion of the coating film being pressed against the substrate. The first heating means may be provided inside the pressing roll as a heater. The apparatus for producing the optical substrate may further include a second heating means for heating the coating film in a state that the long film-shaped mold is released from the coating film.

The apparatus for producing the optical substrate may further include a supporting roll which is arranged at a position facing the pressing roll and which supports the substrate from therebelow.

The concave-convex pattern of the long film-shaped mold used in the apparatus for producing the optical substrate may be, for example, an irregular concave-convex pattern usable for scattering or diffracting light; an average pitch of concavities and convexities of the irregular concave-convex pattern may be in a range of 100 nm to 1,500 nm; and an average value of depth distribution of the concavities and convexities may be in a range of 20 nm to 200 nm. Further, the substrate may be a glass substrate; and the sol-gel material may include a silica precursor.

The apparatus for producing the optical substrate may further include a roll process apparatus which forms the long film-shaped mold, wherein the roll process apparatus may include: a transporting system which transports a substrate film; a coating unit which coats the substrate film with a concave-convex forming material to form a coating film made of the concave-convex forming material, while the substrate film is being transported; a transfer roll which is located on a downstream side of the coating unit and which transfers the concave-convex pattern to the substrate film coated with the coating film made of the concave-convex forming material; and a radiation light source which emits light to the substrate film. The transporting system may include: a film feeding roll which feeds the substrate film; a nip roll which urges the substrate film toward the transfer roll; a releasing roll which facilitates releasing of the substrate film from the transfer roll; and a film take-up roll which takes up the substrate film having the concave-convex pattern transferred thereto, to wind the substrate film therearound. In this case, the film take-up roll around which the substrate film has been wound may be used as the mold feeding roll which feeds the long film-shaped mold.

According to a fourth aspect of the present invention, there is provided an optical substrate including:
a substrate;
a sol-gel material layer; and
a film-shaped mold having a concave-convex pattern arranged on the sol-gel material layer, wherein the sol-gel material layer has the concave-convex pattern which is transferred on the substrate by using the film-shaped mold having the concave-convex pattern; and the concave-convex pattern of the film-shaped mold is engaged with the concave-convex pattern of the sol-gel material layer.

In the method for producing the optical substrate of the present invention, since the sol-gel material is used as the concave-convex pattern forming material and the roll process with the long film-shaped mold is utilized to form the concave-convex pattern made of the sol-gel material, it is possible to produce an optical substrate with high throughput while performing the pattern transfer accurately and reliably. Since the concave-convex pattern of the optical substrate produced by the method for producing the optical substrate of the present invention is made of the sol-gel material, the concave-convex pattern of the optical substrate is excellent in heat resistance, weather resistance (of which concept includes light resistance), and corrosion resistance. Further, the concave-convex pattern is also resistant to the producing process of an element in which the optical substrate is incorporated, which makes it possible to extend the service life of the element. Thus, the optical substrates obtained by the producing method of the present invention is quite effective for a variety of kinds of devices such as organic EL elements, solar cells, etc., and an organic EL element excellent in the heat resistance, weather resistance and corrosion resistance can be produced by using the optical substrate obtained in this manner. In practicing the method for producing the optical substrate of the present invention, the apparatus for producing the optical substrate of the present invention is optimum.

Since the long film-shaped mold is utilized in the present invention, there are advantages as follows. Namely, regarding a hard mold made of metal, silica, etc., in a case that any defect is found in a concave-convex pattern of the hard mold, it is possible to clean and/or repair the defect. Thus, any failure can be avoided which would be otherwise caused by the transfer of the defect to the substrate. However, in the (long) film-shaped mold, the cleaning and the repair as described above are less likely to be performed easily. On the other hand, the mold made of metal, silica, etc. is in a roll shape, and when any defect occurs due to, for example, clogging in the mold, a transfer device should be immediately stopped to exchange the mold. In contrast, since the transfer using the film-shaped mold is performed while each of the portions of the film-shaped mold is being made to correspond to one of glass substrates, any portion of the film-shaped mold having the defect such as the clogging is marked at an inspection stage, and the transport of the glass substrate can be suspended until the defect portion of the film-shaped mold passes through a predetermined position at which the glass substrate and the coating film are pressed against to each other. Therefore, on the whole, the use of the film-shaped mold can reduce the occurrence of defective product, thereby making it possible to improve the throughput. Further, in a case that an attempt is made to transfer the concave-convex pattern of the hard mold made of metal, silica. etc. directly to the substrate, various limitations as described below arise, due to which any desired performance cannot be realized sufficiently in some cases. For example, in a case of using a hard substrate made of glass, etc. as the substrate, the mold and the substrate are both hard. Therefore, when the pressing pressure for the mold is increased, any damage such as cracking or breakage of the substrate occurs; on the contrary, when the pressing pressure for the mold is decreased, the transferred concave-convex pattern is shallow, etc., and thus the pressing pressure is hard to adjust. Therefore, there is no choice but to use a soft material for the substrate or to use a soft material for the mold. In a case of using a film-shaped mold (soft mold), there are provided separate two steps that are a step of firstly preparing (producing) a film-shaped mold from a metallic mold, and another step of using the film-shaped mold to perform the transfer to the sol-gel material layer, while selecting suitable materials for these two steps, respectively, thereby making it possible to use a desired material on a desired substrate in each of these steps, realizing satisfactory transfer not only satisfying the required properties but also generating no defective portions in the pattern and with satisfactory releasability.

In the present invention, the transfer is performed by pressing the concave-convex pattern, of the film-shaped mold, on which the coating film of the sol-gel material has been formed in advance, against the substrate. Thus, there are the following advantages over a case that the concave-convex pattern of a mold is pressed on a substrate on which the coating film has been formed. As the first advantage, the present invention makes it possible to form a more uniform coating film (coating film having a uniform thickness) with high throughput. In order to form a uniform coating film, it is necessary that the distance between an end portion of a nozzle discharging the sol-gel material and a surface to be coated (surface on which the coating film is to be formed) is maintained to be constant during the discharge of the sol-gel material to form the coating film. In a case of forming the coating film on the substrate while moving the substrate and the nozzle relative to each other, it is not possible to maintain the distance between the surface to be coated and the end portion of the nozzle to be constant unless the parallel precision in the relative movement of the nozzle and the substrate and the flatness of a substrate table which transports the substrate are sufficient, and thus any uniform coating film cannot be formed. In contrast, in a case of forming the coating film on the film-shaped mold while moving the film-shaped mold relative to the nozzle, the nozzle can be fixed, thereby making it easy to maintain the distance between the surface of the film-shaped mold to be coated and the nozzle to be stable. Further, in the case of forming the coating film on the substrate while moving the substrate and the nozzle relative to each other, the discharging of the sol-gel material needs to be started and stopped in synchronization with an end portion of the substrate. On the other hand, in the case of forming the coating film on the film-shaped mold, the sol-gel material can be continuously discharged while moving the film-shaped mold relative to the nozzle, thereby making it possible to avoid any abnormality in the thickness (film thickness) of the coating film such as unevenness (irregularity), streak (line), etc., which would be otherwise caused due to the change in the discharge speed of the sol-gel material at the start and stop of the discharge. This further eliminates any acceleration/deceleration times, which in turn makes it possible to form the coating film with high throughput.

As the second advantage, the present invention can simplify the apparatus configuration. In the case of forming the coating film on the substrate, the coating section needs to be provided at the outside of the transporting apparatus for the film-shaped mold. In the present invention, however, the coating section can be incorporated (integrated) into the transporting apparatus for the film-shaped mold, thereby simplifying the apparatus configuration. As the third advantage, the present invention can form a concave-convex pattern, which is faithful to the concave-convex pattern of the mold, on the substrate. Further, in a case of transferring the concave-convex pattern of the mold to the substrate after forming the coating film of the sol-gel material on the substrate, the coating film is dried during the period from the formation of the coating film on the substrate until the coating film is adhered to the substrate, and thus the viscosity of the coating film is increased. Therefore, in order to faithfully transfer the concave-convex pattern of the mold to the coating film, it is necessary to accurately measure the drying state of the coating film and to maintain the viscosity of the coating film to be constant. Further, there is such a possibility that air might enter into a space between the concave-convex pattern and the coating film and that any defect in the pattern might occur. On the other hand, in the present invention, since the sol-gel material discharged from the nozzle is directly applied to the concave-convex pattern of the mold, the viscosity of the sol-gel material at a time when the sol-gel material is applied to the mold is relatively low and maintained to be constant. Therefore, the sol-gel material can be applied to the mold so as to cover the concavities and convexities without any gaps, thereby making it possible to faithfully transfer the concave-convex pattern of the mold to the coating film regardless of the drying state after the coating. In particular, since the sol-gel material enters into the concave-convex pattern by the capillary action, the air hardly enters into the space between the film-shaped mold and the coating film, thus any defect in the pattern caused due to the air entering between the film-shaped mold and the coating film is suppressed. Furthermore, the film-shaped mold is electrically charged easily, and thus any foreign matter easily adheres to the film-shaped mold after the film-shaped mold is fed out from the film feeding roll until the film-shaped mold is pressed against the substrate. In the present invention, however, the film-shaped mold is hardly charged because the film-shaped mold is coated with the sol-gel material, thus the adhesion of any foreign matter is suppressed. Moreover, in the case that the concave-convex pattern of the mold is transferred to the substrate after forming the coating film of the sol-gel material on the substrate, there is such a possibility that the adhesion of any foreign matter might cause a pattern defect which has a size (area) larger than the adhered foreign matter due to any air entering between the film and the coating film. On the other hand, in the present invention, the sol-gel material is applied directly to the mold. Thus, even if the adhesion of any foreign matter caused, any adhered foreign matter is embedded in the coating film, due to which the entering of air hardly occurs, which results in a smaller pattern defect.

BRIEF DESCRIPTION OF THE DRAWINGS

FIG. 11 is a view depicting the cross-sectional configuration of an organic EL element produced in a modification of an embodiment of a producing method for producing an organic EL element of the present invention, by stacking a transparent electrode, an organic layer and a metal electrode on a surface, of an optical substrate, on the opposite side to a concave-convex surface of the optical substrate.

DESCRIPTION OF THE PREFERRED EMBODIMENTS

Figure 1:
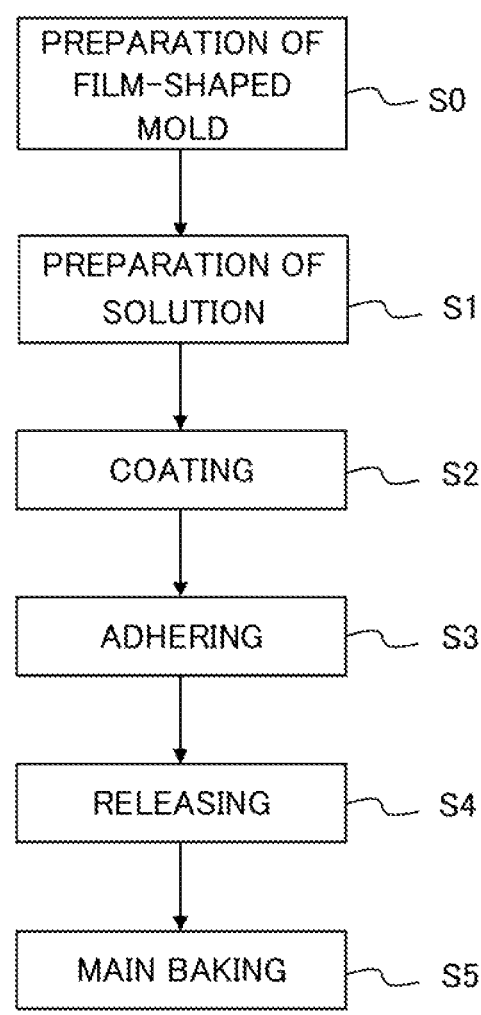
FIG. 1 is a flowchart showing an optical substrate-producing method for producing an optical substrate of the present invention.

In the following, an embodiment of the optical substrate-producing method and apparatus for producing an optical substrate of the present invention will be described with reference to the drawings. As depicted in FIG. 1, the method for producing an optical substrate having a concave-convex pattern of the present invention mainly includes: a step S0 of preparing a film-shaped mold; a preparation step S1 of preparing a sol-gel material; a coating step S2 of coating a concave-convex pattern of the film-shaped mold with the prepared sol-gel material (applying the prepared sol-gel material on a concave-convex pattern of the film-shaped mold) to form a coating film; an adhering step S3 of adhering the coating film formed on the concave-convex pattern of the film-shaped mold to a substrate by pressing the coating film against the substrate with a pressing roll; a releasing step (peeling step) S4 of releasing (peeling off) the film-shaped mold from the coating film; and a main baking step S5 of performing main baking for the coating film. Each of the steps will be successively explained as follows.

[Step for Preparing Film-Shaped Mold]

The film-shaped mold used for producing an optical member of the present invention is a film-shaped or sheet-shaped mold which is long (elongated, having a long length), flexible, and has a concave and convex transfer pattern (concave-convex transfer pattern) on a surface thereof. The film-shaped mold is made, for example, of an organic material such as silicone resin, polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate. The concave-convex pattern may be formed directly in each of the materials, or may be formed in (on) a covering material (coating material) with which a base material (substrate sheet) formed of the above-mentioned materials is coated or covered. It is possible to use photo-curable resin, thermosetting resin, and thermoplastic resin as the covering material.

The film-shaped mold may be, for example, a long mold of which length is not less than 100 meters, of which width is in a range of 50 mm to 3,000 mm, and of which thickness is in a range of 1 µm to 500 µm. The size of the film-shape mold, in particular, the length thereof can be set appropriately based on the size of an optical substrate to be mass-produced, the number of optical substrates (the number of lots) continuously produced in a single producing process, etc. A surface treatment, an easy-adhesion treatment, etc., may be performed to improve the adhesion property between the substrate and the covering material. Further, a mold-release treatment may be performed on each surface of the concave-convex pattern as needed. The concave-convex pattern may be formed to have any profile by any method.

Although the concave-convex pattern of the film-shaped mold varies depending on the usage of the optical substrate as a finally obtained product, the concave-convex pattern may be formed to have any shape with any method. For example, the concave-convex pattern may be any pattern such as those having a micro lens array structure, a structure having the light scattering function, light diffracting function, etc.; and the like. The concave-convex pattern, for example, may be an irregular concave-convex pattern in which pitches of concavities and convexities are non-uniform and the orientations of the concavities and convexities have no directionality. In a case that the optical substrate is used, for example, for scattering or diffracting visible light, the average pitch of the concavities and convexities can be within a range of 100 nm to 1,500 nm, and is more preferably within a range of 200 nm to 1,200 nm. In a case that the average pitch of the concavities and convexities is less than the lower limit, the pitches are so small relative to the wavelengths of the visible light that the diffraction of light by the concavities and convexities is likely to be insufficient; on the other hand, in a case that the average pitch exceeds the upper limit, the diffraction angle is so small that the functions as an optical element such as the diffracting grating are more likely to be lost. In a similar usage, the average value (average height) of the depth distribution of the concavities and convexities is preferably in a range of 20 nm to 200 nm, and more preferably in a range of 30 nm to 150 nm. The standard deviation of the depth of convexities and concavities is preferably within a range of 10 nm to 100 nm, and more preferably within a range of 15 nm to 75 nm. Scattered and/or diffracted light(s) by such a concave-convex pattern is a light having a wavelength in a relatively broad band, rather than a light having a single wavelength or a light having a wavelength in a narrow band, and the scattered and/or diffracted light(s) have no directivity, and travel(s) in every direction.

Note that the term "average pitch of the concavities and convexities" means an average value of the pitch of concavities and convexities in a case of measuring the pitch of the concavities and convexities (spacing distance between adjacent convex portions or spacing distance between adjacent concave portions) in a surface on which the convexities and concavities are formed. Such an average value of the pitch of concavities and convexities is obtained as follows. Namely, a concavity and convexity analysis image is obtained by measuring the shape of the concavities and convexities on the surface by using a scanning probe microscope (for example, a scanning probe microscope manufactured by Hitachi High-Tech Science Corporation, under the product name of "E-sweep", etc.), under the following measurement conditions, then the distances between randomly selected concave portions or convex portions adjacent to each other are measured at not less than 100 points in the concavity and convexity analysis image, and then the average of the distances is calculated and is determined as the average value of the pitch of concavities and convexities.

The measurement conditions are as follows:
Measurement mode: cantilever intermittent contact mode
Material of the cantilever: silicon
Lever width of the cantilever: 40 μm
Diameter of tip of chip of the cantilever: 10 nm Further, in the present application, the average value of the depth distribution of concavities and convexities and the standard deviation of the depth of concavities and convexities can be calculated by the following manner. Namely, a concavity and convexity analysis image is obtained by measuring the shape of the concavities and convexities on the surface by using a scanning probe microscope (for example, a scanning probe microscope manufactured by Hitachi High-Tech Science Corporation, under the product name of "E-sweep", etc.), in a randomly selected measurement region of 3 μm square (vertical: 3 μm, horizontal: 3 μm) or in a randomly selected measurement region of 10 μm square (vertical: 10 μm, horizontal: 10 μm) under the above-described condition. When doing so, data of height of concavities and convexities at not less than 16,384 points (vertical: 128 points×horizontal: 128 points) are obtained within the measurement region, each in nanometer scale. Note that although the number of measurement points is different depending on the kind and setting of the measuring device which is used, for example in a case of using the above-described scanning probe microscope manufactured by Hitachi High-Tech Science Corporation, under the product name of "E-sweep", it is possible to perform the measurement at measurement points of 65,536 points (vertical: 256 points×horizontal: 256 points; namely, the measurement in a resolution of 256×256 pixels) within the measurement region of 3 μm square or 10 μm square. With respect to the height of concavities and convexities (unit: nm) measured in such a manner, at first, a measurement point "P" is determined, among all the measurement points, which is the highest from the surface of a transparent support substrate. Then, a plane which includes the measurement point P and which is parallel to the surface of the transparent support substrate is determined as a reference plane (horizontal plane), and a depth value from the reference plane (difference obtained by subtracting, from the value of height from the transparent support substrate at the measurement point P, the height from the transparent support substrate at each of the measurement points) is obtained as the data of depth of concavities and convexities. Note that such a depth data of the concavities and convexities can be obtained, for example, by performing automatic calculation with software in the measurement device (for example, the above-described scanning probe microscope manufactured by Hitachi High-Tech Science Corporation, under the product name of "E-sweep"), and the value obtained by the automatic calculation in such a manner can be utilized as the data of depth of concavities and convexities. After obtaining the data of depth of concavity and convexity at each of the measurement points in this manner, the values, which can be calculated by obtaining the arithmetic average value and the standard deviation of the obtained data of depth of concavity and convexity, are adopted as the average value of the depth distribution of concavities and convexities and the standard deviation of the depth of concavities and convexities. In this specification, the average pitch of concavities and convexities, the average value of the depth distribution of concavities and convexities, and the standard deviation of the depth of concavities and convexities can be obtained via the above-described measuring method, regardless of the material of the surface on which the concavities and convexities are formed.

The light(s) scattered and/or diffracted by such a concave-convex pattern is (are) a light having a wavelength in a relatively broad band, rather than a light having a single wavelength or a light having a wavelength in a narrow band, and the scattered and/or diffracted light(s) have no directivity, and travel(s) in various directions. Note that, however, the term "irregular concave-convex pattern" includes such a quasi-periodic structure in which a Fourier-transformed image, obtained by performing a two-dimensional fast Fourier-transform processing on a concavity and convexity analysis image obtained by analyzing a concave-convex shape on the surface, shows a circular or annular pattern, namely, such a quasi-periodic pattern in which, although the concavities and convexities have no particular orientation (directionality), the structure has the distribution of the pitches of concavities and convexities (the pitches of the concavities and convexities vary). Therefore, the substrate having such a quasi-periodic structure is suitable for a diffraction substrate used in a surface-emitting element etc., such as the organic EL element, a transparent conductive substrate of a solar cell, and the like, provided that the substrate has the concavities and convexities of which pitch distribution or pitch variability enables the substrate diffract visible light.

Figure 2:
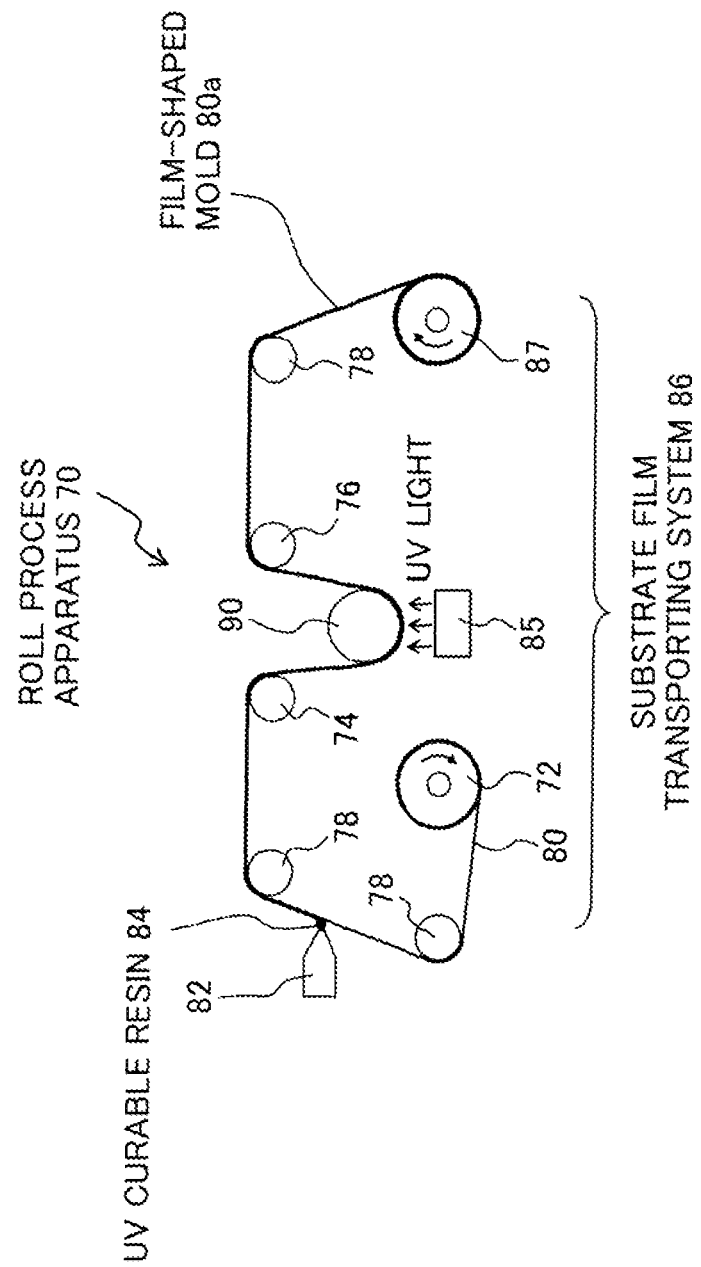
FIG. 2 is a conceptual view of a roll process apparatus for producing a film-shaped mold usable in the optical substrate-producing method of the present invention.

An exemplary method for producing the long film-shaped mold used in the present invention will be explained with reference to FIG. 2. A roll process apparatus (first unit) 70 depicted in FIG. 2 is an apparatus for producing the film-shaped mold by forming a concave-convex pattern on a coating film formed on a long substrate film. The roll process apparatus 70 is mainly provided with a transporting system 86 configured to transport a substrate film (base member or a film-shaped base member) 80; a die coater 82 configured to coat the substrate film 80, which is being transported, with a material for forming concavities and convexities (concave-convex forming material); a transfer roll (metal mold) 90) located on the downstream of the die coater 82 and configured to transfer a pattern; and an irradiation light source 85 which is disposed to face the transfer roll 90 with the substrate film 80 being intervened between the irradiation light source 85 and the transfer roll 90, and which is configured to irradiate an UV light onto the substrate film 80. The transporting system 86 for transporting the substrate film 80 has a film feeding roll 72 configured to feed the substrate film 80; a nip roll 74 and a releasing roll 76 arranged respectively on the upstream and the downstream of the transfer roll 90 and configured to urge the substrate film 80 toward the transfer roll 90; a film take-up roll (film winding roll) 87 configured to take up (wind up) a substrate film 80a (film-shaped mold) having the pattern transferred thereon to wind the substrate film 80a therearound; and a plurality of transporting rolls 78 configured to transport the substrate film 80.

The roll process apparatus 70 is used to obtain a film-shaped mold, with the following process. The substrate film 80 wound around the film feeding roll 72 in advance is fed toward the downstream by the rotation of the film feeding roll 72, the film take-up roll 87, etc. When the substrate film 80 passes the die coater 82, the die coater 82 applies a concave-convex forming material 84 on a surface of the substrate film 80, and the surface of the substrate film 80 is coated with a concave-convex forming material (UV curable resin) 84, thereby forming a coating film having a predetermined thickness on the substrate film 80. Subsequently, the coating film on the substrate film 80 is pressed against the outer circumferential surface of the transfer roll 90 by the nip roll 74, thereby transferring the pattern on the outer circumferential surface of the transfer roll 90 to the coating film. Concurrently with or immediately after the pattern transfer, the coating film is irradiated with the UV light from the irradiation light source 85, thereby curing the concave-convex forming material 84. Although the wavelength of the UV light is different depending on the kind or property of the concave-convex forming material 84, the wavelength is generally in a range of 200 nm to 450 nm; the irradiation amount of the UV light may be in a range of 10 mJ/cm$^2$ to 5 J/cm$^2$. The substrate film 80 coated with the concave-convex forming material having the cured pattern is released away from the transfer roll 90 by the releasing roll 76, and then is took up (wound up) by the take-up roll 87. In such a manner, the long film-shaped mold 80a can be obtained. Such a long film-shaped mold 80a is obtained while being wound in a roll form, and thus is suitable for a mass production process of an optical substrate using a pressing roll (to be described later on), and has a suitable shape or form for being transported to an apparatus for mass-producing the optical substrate. Further, by temporarily winding the film-shaped mold around a roll after the film-shaped mold has been produced, the film-shaped mold can be stored or aged in the rolled form.

In the producing process described above, the substrate film 80 is exemplified, for example, by base members made of organic materials such as silicone resin, polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate. The thickness of the substrate film may be in a range of 1 μm to 500 μm.

Examples of the concave-convex forming material 84 include curable resins including a variety of kinds of UV curable resin such as epoxy resin, acrylic resin, methacrylic resin, vinyl ether resin, oxetane resin, urethane resin, melamine resin, urea resin, polyester resin, phenol resin, cross-linking type liquid crystal resin, fluorine resin, and silicone resin. The thickness of the curable resin is preferably in a range of 0.5 μm to 500 μm. In a case that the thickness is less than the lower limit, heights of the concavities and convexities formed on the surface of the cured resin layer are more likely to be insufficient. In a case that the thickness exceeds the upper limit, there is such a possibility that the effect of volume change of the resin which occurs upon curing is likely to be so large that the formation of the shape of the concavities and convexities tends to be unsatisfactory.

In the above-described producing process, although the die coating method with the die coater is used for performing coating with the concave-convex forming material 84, it is possible to adopt various coating methods such as the spin coating method, spray coating method, dip coating method, dropping method, gravure printing method, screen printing method, relief printing method, curtain coating method, ink-jet method, and sputtering method. Further, the condition for curing the concave-convex forming material 84 such as the curable resin varies depending on the kind of the resin used. For example, the curing temperature is preferably in a range of the room temperature to 250 degrees Celsius; and the amount of the UV irradiation is preferably in a range of 10 mJ/cm$^2$ to 5 J/cm$^2$. Alternatively, the concave-convex forming material 84 may be cured by being irradiated with energy ray such as electron beam, rather than with the UV light.

The transfer roll 90 used in the above-mentioned producing process may be, for example, a transfer roll having a pattern directly formed in (on) a surface thereof (roll surface); a transfer roll in which a substrate having a pattern such as a metal substrate is wound on the roll and then fixed thereto; or a transfer roll formed by producing a cylindrical substrate having a pattern and by fitting and fixing the patterned cylindrical substrate to the roll. The transfer roll 90 may be made of a hard material other than the metal.

Here, an explanation will be given about a method for forming a concave-convex pattern provided on the surface of the transfer roll π. It is preferred that the concave-convex pattern be formed by a method of utilizing the self-organization or self-assembly (micro phase separation) of a block copolymer described in International Publication No. WO2012/096368 A1 of the applicants of the present invention (hereinafter referred to as "BCP (Block Copolymer) method" as appropriate), a method of heating and cooling a vapor deposited film on a polymer film to form concavities and convexities of wrinkles on a surface of polymer, as disclosed in International Publication No. WO2011/007878 A1 of the applicants of the present invention (hereinafter referred to as "BKL (Buckling) method" as appropriate), etc. The photolithography method may be utilized instead of the BCP and BKL methods. In a case that the pattern is formed by the BCP method, although the pattern made of any material can be used, the material is preferably a block copolymer composed of a combination of two selected from the group consisting of a styrene-based polymer such as polystyrene; polyalkyl methacrylate such as polymethyl methacrylate; polyethylene oxide; polybutadiene; polyisoprene; polyvinylpyridine; and polylactic acid.

The pitches and heights of concavities and convexities of the pattern are arbitrary. However, for example, in a case that the pattern is used as the diffraction grating scattering or diffracting light in a visible region, the average pitch of the concavities and convexities is preferably in a range of 100 nm to 1,500 nm, more preferably in a range of 200 nm to 1,200 nm. In a case that the average pitch of the concavities and convexities is less than the lower limit, the pitches are so small relative to wavelengths of the visible light that the diffraction of the light by the concavities and convexities is less likely to occur. In a case that the average pitch exceeds the upper limit, the diffraction angle is so small that functions as an optical element such as the diffraction grating are more likely to be lost. The average value of the depth distribution of the concavities and convexities is preferably in a range of 20 nm to 200 nm, and more preferably in a range of 30 nm to 150 nm. In a case that the average value of the depth distribution of concavities and convexities is less than the lower limit, the height is so short relative to the wavelengths of the visible light that the required diffraction is less likely to occur. On the other hand, in a case that the average value exceeds the upper limit, the intensity of diffracted light becomes non-uniform, which in turn results in the following tendency. Namely, when such a concave-convex pattern is used, for example, as an optical element for the light extraction of an organic EL element, the electric field distribution in an EL layer becomes non-uniform, thereby causing the electric field to concentrate on a certain position or area in the EL layer and thus causing any leak current to be easily generated, and/or shortening the service life of the optical element.

After forming the master block of the pattern by the BCP or BKL method, further, a mold to which the pattern is transferred can be formed by the electroforming method, etc., as follows. At first, it is possible to form, on the master block having the pattern to be transferred, a seed layer functioning as an electroconductive layer for the electroforming process by the non-electrolytic plating, sputtering, vapor deposition, etc. The thickness of the seed layer is preferably not less than 10 nm to uniformize the current density during the subsequent electroforming process and to thereby allowing a metal layer accumulated by the subsequent electroforming process to have a uniform thickness. As the material of the seed layer, it is possible to use, for example, nickel, copper, gold, silver, platinum, titanium, cobalt, tin, zinc, chrome, gold-cobalt alloy, gold-nickel alloy, boron-nickel alloy, solder, copper-nickel-chromium alloy, tin-nickel alloy, nickel-palladium alloy, nickel-cobalt-phosphorus alloy, or alloy thereof. Subsequently, a metal layer is accumulated on the seed layer by the electroforming (electroplating). The entire thickness of the metal layer including the thickness of the seed layer can be, for example, in a range of 10 μm to 3,000 μm. As the material of the metal layer to be accumulated by the electroforming, it is possible to use any of the metal species as described above which can be used as the seed layer. It is preferable to use nickel as the material of the metal layer in view of the wear resistance, the releasing property, etc. of a metal substrate to be obtained as the mold. In this case, nickel is preferably used also for the seed layer. Considering the easiness for performing the subsequent processes for forming the mold such as pressing with respect to a resin layer, releasing, and cleaning, the formed metal layer desirably has appropriate hardness and thickness.

The metal layer including the seed layer obtained as described above is released (peeled off) from the master block having the concave-convex structure to obtain a metal substrate. As the releasing method, the metal layer may be peeled off physically, or the material(s) composing the pattern of the master block may be dissolved to be removed by using an organic solvent which can dissolve the material(s), such as toluene, tetrahydrofuran (THF), and chloroform. In a case that the metal substrate is peeled off from the master block, a remaining material component on the metal substrate can be removed by cleaning. As the cleaning method, it is possible to use wet cleaning using a surfactant etc., or dry cleaning using an ultraviolet ray and/or plasma. Alternatively, for example, the remaining material component may be attached to an adhesive agent or a bonding agent then be removed. Accordingly, the metal substrate to which the pattern has been transferred from the master block can be obtained. The transfer roll 90 having the concave-convex pattern can be obtained by winding or putting the metal substrate obtained as described above around the surface of a roll body. It is possible to form the film-shaped mold by using the transfer roll 90 by the above producing process. It goes without saying that the long film-shaped mold is not required to be produced on site, and that a long film-shaped mold produced by a manufacturer such as a film manufacturer may be used. The step of preparing the film-shaped mold may be performed before the coating step S2 which will be described later. Thus, it is not indispensable to perform the step of preparing the film-shaped mold before the sol-gel material preparation step S1.

[Sol-Gel Material Preparation Step]

In the method for producing the optical substrate of the present invention, the sol-gel material (sol solution or sol) is prepared, by the sol-gel method, so as to form the coating film to which the pattern is to be transferred (step S1 of FIG. 1). For example, in a case that silica is synthesized on a substrate by the sol-gel method, a sol-gel material of metal alkoxide (silica precursor) is prepared. The silica precursor is exemplified by metal alkoxides including, for example, tetraalkoxide monomers such as tetramethoxysilane (TMOS), tetraethoxysilane (TEOS), tetra-i-propoxysilane, tetra-n-propoxysilane, tetra-i-butoxysilane, tetra-n-butoxysilane, tetra-sec-butoxysilane, and tetra-t-butoxysilane; trialkoxide monomers such as methyl trimethoxysilane, ethyl trimethoxysilane, propyl trimethoxysilane, isopropyl trimethoxysilane, phenyl trimethoxysilane, methyl triethoxysilane, ethyl triethoxysilane, propyl triethoxysilane, isopropyl triethoxysilane, phenyl triethoxysilane, methyl tripropoxysilane, ethyl tripropoxysilane, propyl tripropoxysilane, isopropyl tripropoxysilane, phenyl tripropoxysilane, methyl triisopropoxysilane, ethyl triisopropoxysilane, propyl triisopropoxysilane, isopropyl triisopropoxysilane, phenyl triisopropoxysilane, tolyl-triethoxysilane; dialkoxide monomers such as dimethyl dimethoxysilane, dimethyl diethoxysilane, dimethyl dipropoxysilane, dimethyl diisopropoxysilan, dimethyl di-n-butoxysilane, dimethyl di-i-butoxysilane, dimethyl di-sec-butoxysilane, dimethyl di-t-butoxysilane, diethyl dimethoxysilane, diethyl diethoxysilane, diethyl dipropoxysilane, diethyl diisopropoxysilane, diethyel di-n-butoxysilane, diethyel di-i-butoxysilane, diethyl di-sec-butoxysilane, dipropyl di-t-butoxysilane, dipropyl dimethoxysilane, dirpopyl diethoxysilane, dipropyl di-propoxysilane, dipropyl diisopropoxysilane, dirpopyl di-n-butoxysilane, dipropyl di-i-butoxysilane, dipropyl di-sec-butoxysilane, dipropyl di-t-butoxysilane, diisopropyl dimethoxysilane, diisopropyl diethoxysilane, diisopropyl dipropoxysilane, diisopropyl diisopropoxysilane, diisopropyl di-n-butoxysilane, diisopropyl di-i-butoxysialne, diisopropyl di-sec-butoxysilane, diisopropyl di-t-butoxysilane, diphenyl dimethoxy silane, diphenyl diethoxy silane, diphenyl dipropoxy silane, diphenyl diisopropoxysilane, diphenyl di-n-butoxysilane, diphenyl di-i-butoxysilane, diphenyl di-sec-butoxysilane, diphenyl di-t-butoxysilane; a polymer obtained by polymerizing the above monomers in small amounts; and a composite material characterized in that a functional group and/or a polymer is/are introduced into a part of the above material. Further, it is allowable that a part or the all of these alkyl group and the phenyl group is substituted by fluorine. Furthermore, the silica precursor is exemplified, for example, by metal acetylacetonate, metal carboxylate, oxychloride, chloride, and mixtures thereof. However, the silica precursor is not limited to these. Moreover, examples of the metal species other than Si include Ti, Sn, Al, Zn, Zr, In and mixtures thereof, but the examples of the metal species are not limited to these. It is also possible to use any appropriate mixture of precursors of the oxides of the above metals. Further, it is also allowable to perform the hydrophobic treatment for the surfaces of a coating film made from the precursor. Any known method for the hydrophobic treatment may be used. For example, regarding the surface of silica, the hydrophobic treatment can be performed with dimethyl dichlorosilane, trimethyl alkoxysilan, etc., or with a trimethylsilylating agent such as hexamethyl-disilazane and a silicone oil. Alternatively, it is also allowable to employ a surface treatment method for a surface of metal oxide powder with supercritical carbon dioxide.

In a case that a mixture of TEOS and MTES is used, the mixture ratio thereof can be, for example, 1:1 in a molar ratio. The sol-gel material produces amorphous silica by being subjected to the hydrolysis and polycondensation reaction. An acid such as hydrochloric acid or an alkali such as ammonia is added in order to adjust the pH of the solution as a synthesis condition. The pH is preferably not more than 4 or not less than 10. Water may be added to perform the hydrolysis. The amount of water to be added can be not less than 1.5 times, with respect to the amount of metal alkoxide species, in the molar ratio. It is possible to use, as the sol-gel material, a material other than the silica. For example, a titanium-based material, a material based on indium tin oxide (ITO), $Al_2O_3$, $ZrO_2$, ZnO, etc. may be used.

Examples of the solvent of the sol-gel material include alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexytoxyethyl alcohol, methoxy-2-propanol, and benzyloxyethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone halogen-containing solvents such as chloroform, methylene chloride, tetrachloroethane, monochlorobenzene, and dichlorobenzene; hetero-element containing compounds such as carbon disulfide; water; and mixture solvents thereof. Especially, ethanol and isopropyl alcohol are preferable. Further, a mixture of water and ethanol, and a mixture of water and isopropyl alcohol are also preferable.

As an additive of the sol-gel material, it is possible to use polyethylene glycol, polyethylene oxide, hydroxypropylcellulose, and polyvinyl alcohol for viscosity adjustment; alkanolamine such as triethanolamine, β-diketone such as acetylacetone, β-ketoester, formamide, dimethylformamide, and dioxane, etc., as a solution stabilizer.

Note that it is allowable to use a photo-curable sol-gel material, other than using the sol-gel material which is cured by being heated. In such a case, it is possible to adopt, for example, a method in which photo-acid generator such as hexafluorophosphate aromatic sulfonium salt which generates acid by light is used, or a method in which chemical modification (chelation) is caused by adding β-diketone represented by acetylacetone to a sol solution (sol) and the chemical modification is removed by being irradiated with light.

[Coating Step]

Figure 3:
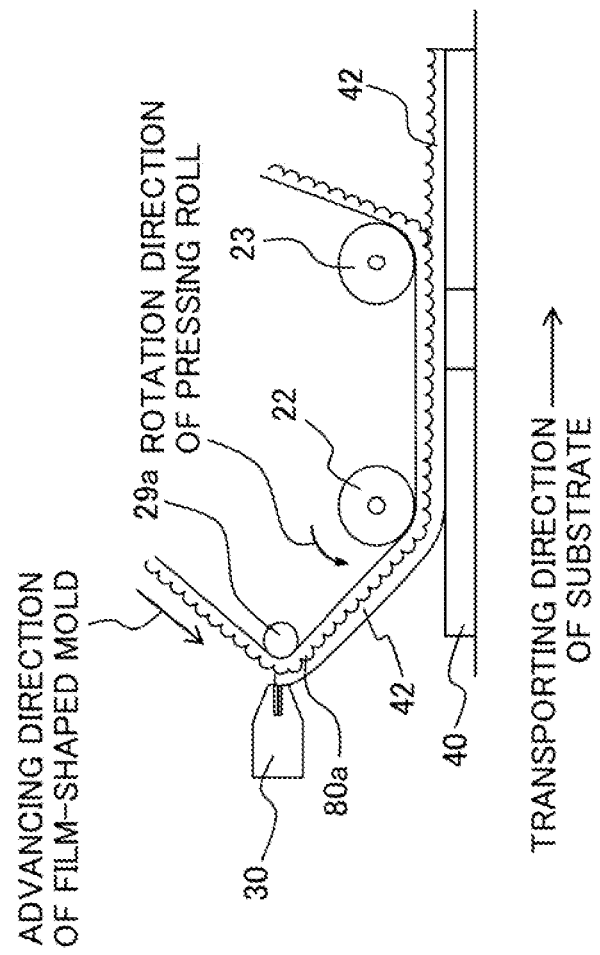
FIG. 3 is a conceptual view for depicting a roll process using the film-shaped mold.

The concave-convex pattern of the film-shaped mold, prepared in the above-described step S0 is coated with the sol-gel material prepared as described above (the sol-gel material is applied on the concave-convex pattern of the film-shaped mold) (step S2 in FIG. 1). For example, by feeding the film-shaped mold 80a to the vicinity of the end portion of the die coater 30 and by discharging a sol-gel material 41 from the die coater 30 as depicted in FIG. 3, it is possible to form a coating film (sol-gel material layer) 42 on the concave-convex pattern of the film-shaped mold 80a. From the viewpoint of mass-production, it is preferable that the film-shaped mold 80a is continuously coated with the sol-gel material 41 by the die coater 30 arranged at a predetermined position while the film-shaped mold 80a is being transported continuously. As the coating method, it is possible to adopt any coating method such as the bar coating method, spray coating method, die coating method, ink-jet method, etc. Among these methods, the die coating method is preferable since the die coating method is capable of uniformly coating the film-shaped mold having a relatively large area with the sol-gel material, and is capable of quickly completing the coating before the sol is gelated.

[Adhering Step]

The coating film on the film-shaped mold formed in the above-described step S2 is pressed against the substrate with the pressing roll (laminating roll) so as to adhere the coating film on the concave-convex pattern of the film-shaped mold to the substrate (Step S3 in FIG. 1). For example, as depicted in FIG. 3, it is possible to adhere the coating film 42 on the concave-convex pattern of the film-shaped mold 80a to a substrate 40 by feeding the film-shaped mold 80a having the coating film 42 formed thereon between the pressing roll 22 and the substrate 40 which is being transported immediately below (beneath) the pressing roll 22. Namely, when the coating film 42 on the film-shaped mold 80a is pressed against the substrate 40 with the pressing roll 22, the surface of the substrate 40 is covered by the coating film 42 on the film-shaped mold 80a while the film-shaped mold 80a and the substrate 40 are synchronously transported. In this situation, by pressing the pressing roll 22 against the back surface of the film-shaped mold 80a (surface on the side opposite to the surface of the film-shaped mold 80a in which the concave-convex pattern is formed), the coating film 42 on the film-shaped mold 80a is adhered to (stuck onto, laminated onto, or brought into tight contact with) the substrate 40 while the coating film 42 on the film-shaped mold 80a moves (advances) together with the movement of the substrate 40. Note that, in order to feed (guide) the long film-shaped mold 80a to the pressing roll 22, it is helpful to feed the film-shaped mold 80a as it is directly from the film take-up roll 87 (see FIG. 2) around which the long film-shaped mold 80a is wound in the step S0.

The roll process using the pressing roll as described above has the following advantages over the pressing system. Namely, (i) the productivity is improved owing to the roll process, and the productivity can be further improved by using the long (long-length) film-shaped mold; (ii) it is possible to prevent the generation of bubbles of gas in the pattern due to the bumping of the solvent in the sol-gel material or to prevent any trace or mark of gas from remaining; (iii) it is possible to reduce the adhering pressure and the releasing force (peeling force) owing to the line contact with the substrate and the coating film, thereby making it possible to easily handle a substrate with larger area; and (iv) no bubble is included during the pressing. Further, the producing method of the present invention uses the flexible, film-shaped mold as the mold. Therefore, in a case of adhering the sol-gel material layer 42 formed on the concave-convex pattern of the mold onto the substrate 40 which is relatively hard, the sol-gel material layer can be pressed uniformly against the entire surface of the substrate. With this, the sol-gel material layer can be adhered uniformly to the substrate, thereby making it possible to suppress any occurrence of failure in the adhesion between the sol-gel material layer and the substrate.

In this adhering step, the coating film may be pressed against the substrate while the coating film is being heated. As the method for heating the coating film, for example, the heating may be performed via the pressing roll, or the coating film may be heated directly or may be heated from the side of the substrate. In a case of performing the heating via the pressing roll, a heating means may be provided inside the pressing roll (adhering roll), and any heating means may be used. Although such a configuration in which the pressing roll includes a heater inside is suitable, any separate heater different from the pressing roll may be provided. In either case, any pressing roll may be used, provided that the coating film can be pressed while being heated. The pressing roll is preferably a roll having a coating film, which is provided on a surface thereof and which is made of a heat-resisting resin material such as ethylene-propylene-diene rubber (EPDM), silicone rubber, nitrile rubber, fluoro rubber, acrylic rubber, chloroprene rubber, etc. Further, a support roll may be provided to face the pressing roll and to sandwich the substrate between the support roll and the pressing roll, or a support stand configured to support the substrate may be provided, for the purpose of resisting the pressure applied by the pressing roll.

The heating temperature at which the coating film is heated during the pressing of the coating film against the substrate can be in a range of the room temperature to 200 degrees Celsius. In a case of performing the heating with the pressing roll, the heating temperature of the pressing roll can be similarly in a range of the room temperature to 200 degrees Celsius. By heating the pressing roll in such a manner, the mold (film-shaped mold) can be immediately released from the coating film for which the pressing has been performed with the pressing roll, thereby realizing an increased productivity. In a case that the heating temperature of the coating film or the pressing roll exceeds 200 degrees Celsius, there is a fear that the heating temperature might exceed the heat-resisting temperature of the mold made of the resin. By performing the pressing while heating the coating film, it is possible to expect the effect similar to that obtained by pre-baking of the sol-gel material layer, as described below.

After the coating him is pressed against the substrate, the coating film may be subjected to pre-baking. It is preferred to perform the pre-baking in a case that the pressing is performed without heating the coating film. The pre-baking promotes the gelation (curing) of the coating film and solidifies the pattern, thereby making the pattern be less likely to be collapsed during the releasing. In a case that the pre-baking is performed, the heating is preferably performed at a temperature in a range of the room temperature to 200 degrees Celsius in the atmosphere. In a case that a photo-curable sol-gel material is used in the sol-gel material layer 42, it is allowable to promote the gelation (curing) by performing irradiation of light, instead of performing the heating and baking the coating film.

It is allowable to use, as the substrate, substrates made of inorganic materials such as glass, silica glass, and silicon substrates, or substrates made of resins such as polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate. The substrate may be transparent or opaque, and a relatively hard substrate is preferable considering that the sol-gel material layer is adhered on the substrate and further a function layer is formed on the sol-gel material layer when the optical substrate is incorporated into a device. Further, in a case that a concave-convex patterned substrate obtained by using this substrate is to be used for producing an organic EL element as will be described later on, this substrate preferably is a substrate having the heat resistance and the weather resistance against the UV light, etc. In view of this, the substrates made of the inorganic materials such as the glass, silica glass and silicon substrates are more preferable. Since the sol-gel material layer, which is to be adhered to the substrates, is made of the inorganic material, these substrates made of the inorganic materials are preferable because the difference in the refractive index between the substrates made of inorganic materials and the sol-gel material layer is small, and thus any unintended refraction and/or reflection inside the optical substrate can be prevented. It is allowable to perform a surface treatment for the substrate or to provide an easy-adhesion layer on the substrate in order to improve the adhesion property between the substrate and the coating film, and allowable to provide a gas barrier layer in order to keep out moisture and/or gas such as oxygen. Note that a desired concave-convex pattern is formed on (in) the sol-gel material layer in a subsequent or following step, and thus the surface of the substrate (including the surface of the substrate subjected to the surface treatment or the easy-adhesion layer in case that the surface treatment is performed or the easy-adhesion layer is formed) may be flat, and the substrate itself does not have the desired concave-convex pattern.

[Releasing Step]

The mold is released from the coating film (sol-gel material layer) after the adhering step or the pre-baking step (step S4). Since the roll process is used as described above, the releasing force may be smaller than that in a case of using a plate-shaped mold employed in the pressing system, and it is possible to easily release the mold from the coating film without allowing the coating film to be remained on the mold. In particular, since the pressing is performed while heating the coating film, the reaction easily proceeds, and the mold can be easily released from the coating film immediately after the pressing. Further, a releasing roll (peeling roll) may be used for enhancing the releasability (peelability) of the mold. As depicted in FIG. 3, a peeling roll (releasing roll) 23 is provided on the downstream of the pressing roll 22, and the film-shaped mold 80a is supported by the peeling roll 23 which is rotating while being urged by the peeling roll 23 toward the coating film 42. By doing so, it is possible to maintain a state that the film-shaped mold 80a is adhered to the coating film 42 by a distance from the pressing roll 22 up to the peeling roll 23 (for a predetermined period of time corresponding to the above distance). Further, by changing the course of the film-shaped mold 80a such that the film-shaped mold 80a is lifted upward to a position above the peeling roll 23 at the downstream of the peeling roll 23, the film-shaped mold 80a is peeled off (released) from the coating film 42. Note that the pre-baking and/or the heating of the coating film 42 described above may be performed during a period of time when the film-shaped mold 80a is adhered to the coating film 42. Further, in a case of using the peeling roll 23, the peeling off of the film-shaped mold 80a from the coating film 42 can be performed more easily by performing the peeling while performing the heating, for example, at a temperature in a range of the room temperature to 200 degrees Celsius. Further, it is allowable to make the heating temperature of the releasing roll (peeling roll) be higher than the heating temperature of the pressing roll and/or the pre-baking temperature. In such a case, by releasing the coating film while heating the coating film to a high temperature, it is possible to release any gas generated from the coating film and thus to prevent air bubbles from being generated. Regarding a portion of the coating film (coating film portion) which is not adhered to the glass substrate 40, namely, a coating film portion having a length corresponding to a distance (interval) between a certain substrate 40 and another substrate 40 transported after (subsequently to) the certain substrate 40, is allowed to be attached to (disposed on) the film-shaped mold 80a, and is transported together with the film-shaped mold 80a.

[Main-Baking Step]

After the mold is peeled off from the coating film 42 of the substrate 40, the coating film 42 is subjected to the main baking (step S5 in FIG. 1). The hydroxyl group and the like contained in the sol-gel material such as silica, etc. forming the coating film is desorbed or eliminated by the main baking to further strengthen (harden) the coating film. The main baking may be performed at a temperature in a range of 200 degrees Celsius to 1,200 degrees Celsius for a duration of time in a range of about 5 minutes to about 6 hours. In such a manner, the coating film is cured, and a substrate provided with a concave-convex pattern film having a concave-convex pattern corresponding to the concave-convex pattern of the mold, namely a substrate in which the sol-gel material layer having the concave-convex pattern is directly formed on the flat substrate, is obtained. In this situation, in a case that the sol-gel material layer is formed of silica, the sol-gel material layer is amorphous, crystalline or in a mixture state of the amorphous and the crystalline, depending on the baking temperature and baking time. In this embodiment, although the sol-gel material layer is cured by the main baking, the sol-gel material layer may be cured by any other method. For example, in a case that a photo-curable sol-gel material is used for the sol-gel material layer 42, the coating film can be cured by light irradiation, instead of performing the baking of the coating film.

[Apparatus for Producing Optical Substrate]

Figure 4:
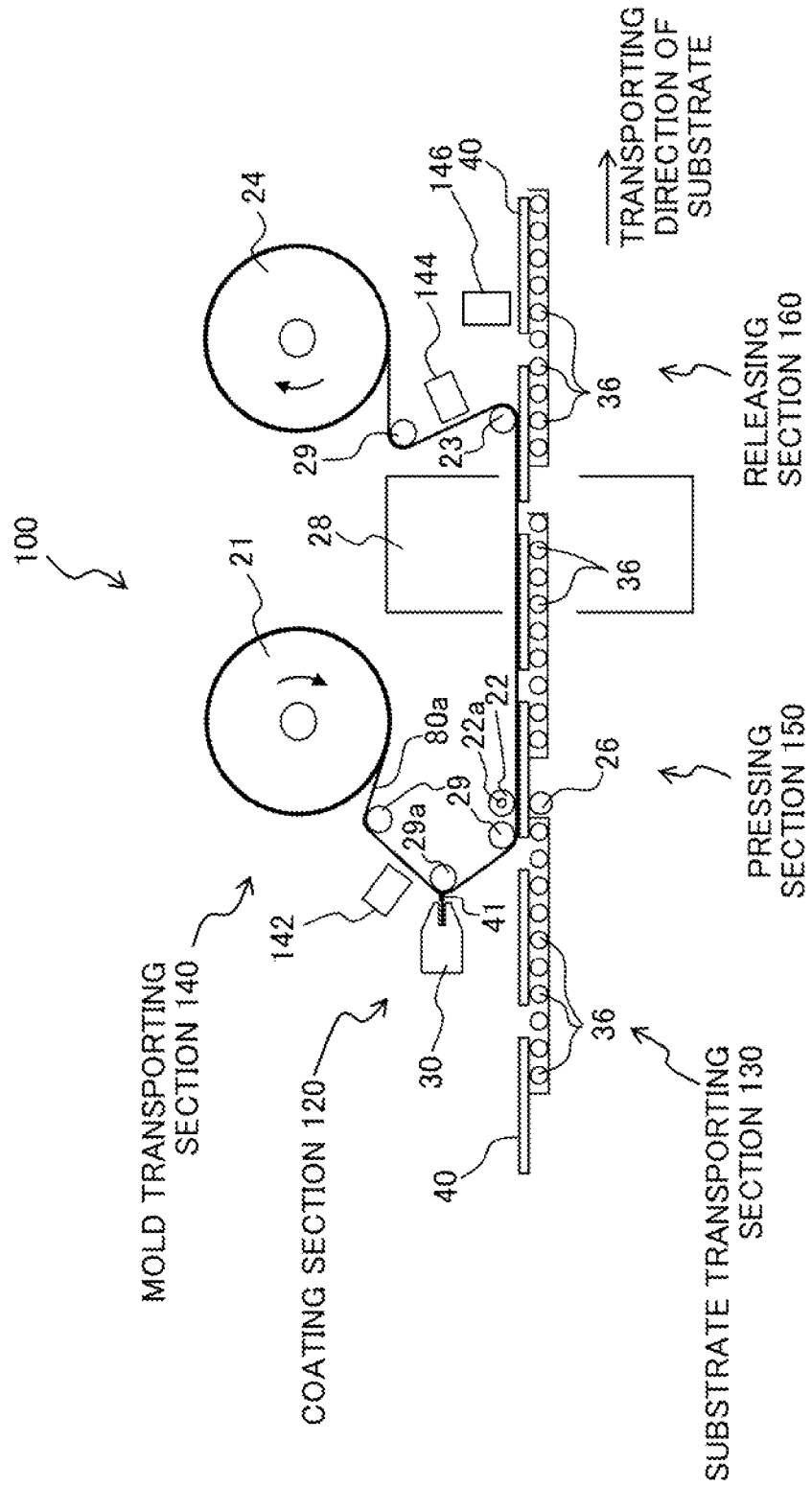
FIG. 4 is a conceptual view of an optical substrate-producing apparatus for practicing the optical substrate-producing method of the present invention.

In order to practice the method for producing the optical substrate of the present invention, for example, an optical substrate-producing apparatus (second unit) 100 configured to produce an optical substrate, as depicted in FIG. 4, can be used. The optical substrate-producing apparatus 100 mainly includes: a substrate transporting section 130 which transports a substrate, a mold transporting section 140 which transports a film-shaped mold 80a; and a coating section (coating film-forming section) 120 which coats the film-shaped mold 80a with a sol-gel material 41 (which applies the sol-gel material 41 on the film-shaped mold 80a), wherein the mold transporting section 140 includes: a pressing section 150 which presses the coating film 42 on the film-shaped mold 80a (see FIG. 3) against the substrate 40 so as to adhere the coating film 42 to the substrate 40; and a releasing section 160 which releases the film-shaped mold 80a from the substrate 40.

The substrate transporting section 130 is provided with a plurality of rotating rolls 36 which are arranged in the transporting direction (from the left side to the right side on the sheet surface of FIG. 4), and transports the substrate 40 placed on the rotating rolls 36 in the transporting direction by driving the rotating rolls 36 to rotate.

The mold transporting section 140 mainly has:
a mold feeding roll 21 which feeds a long film-shaped mold 80a having a concave-convex pattern formed on a concave-convex pattern surface thereof,
a pressing roll 22 which is arranged at a predetermined position on a transporting path of a substrate 40 and which presses a coating film formed on the film-shaped mold 80a by (in) a coating section (film coating section) 120 (to be described later on) against the substrate 40, from a side opposite to the concave-convex pattern surface of the film-shaped mold 80a;
a peeling roll (releasing roll) 23 which is arranged downstream of the pressing roll 22 and which peels off (releases) the film-shaped mold 80a after maintaining a state that the coating film on the film-shaped mold 80a is pressed against the substrate 40 for a predetermined distance;
a mold take-up roll 24 which is arranged downstream of the peeling roll 23 and which takes up the film-shaped mold 80a so that the film-shaped mold 80a is wound around the mold take-up roll 24; and
a transporting roll 29 which transports the film-shaped mold 80a in an advancing direction.

The mold feeding roll 21 and the mold take-up roll 24 are rotatably attached to a support base or stand (not depicted in the drawings) which detachably supports the mold feeding roll 21 and the mold take-up roll 24. Note that it is advantageous to appropriately transport the film take-up roll 87 (see FIG. 2), around which a film-shaped mold 80a which has been previously produced by the roll process apparatus 70 is wound, to the optical substrate-producing apparatus 100 as it is, and to use the film take-up roll 87 as the mold feeding roll 21.

The pressing section 150 is provided with a supporting roll 26 which faces the pressing roll 22. The supporting roll 26 presses the substrate 40 from the lower side of the substrate 40, in a state that the film-shaped mold 80a and the substrate 40 are sandwiched between the supporting roll 26 and the pressing roll 22, and the supporting roll 26 is rotationally driven to feed the substrate 40 to the downstream side in a substrate transporting direction. A heater 22a is provided in the pressing roll 22. A heater may be provided also in the supporting roll 26. In the releasing section 160, the peeling roll 23 is provided on a transport path of the film-shaped mold 80a and the peeling (releasing) of the film-shaped mold 80a from the substrate 40 is promoted by pulling the film-shaped mold 80a upward with the transporting roll 29 disposed on the downstream side of the peeling roll 23 in the transport path of the film-shaped mold 80a. A heating furnace (heater) 28 is provided between the pressing section 150) and the releasing section 160. It is possible to use, for example, an infrared heater, hot-air heating device, and a hot plate as the heating furnace 28. The optical substrate-producing apparatus 100 further includes an electricity-removing unit 142 for removing electricity from the film-shaped mold 80a fed from the mold feeding roll 21; an electricity-removing unit 144 for removing electricity from the film-shaped mold 80a before being taken up by the mold take-up roll 24 to be wound around the mold take-up roll 24; and an electricity-removing unit 146 for removing electricity from the substrate 40 from which the film-shaped mold 80a has been peeled off.

The coating section 120 is located downstream of the mold feeding roll 21 of the mold transporting section 140 and upstream of the pressing section 150, and is provided with a die coater 30 which coats the concave-convex pattern surface of the film-shaped mold 80a with the sol-gel material 41. In order to form a uniform coating film, the distance between the die coater 30 and the film-shaped mold 80a is required to be constant. Accordingly, a holding roll 29a which holds the film-shaped mold 80a in the coating section 120 is arranged so that the holding roll 29a makes contact with the film-shaped mold 80 from the side opposite to (not facing) the concave-convex pattern surface of the film-shaped mold 80a and that the holding roll 29a urges the film-shaped mold 80a toward the die coater 30. Namely, the film-shaped mold 80a is moved to pass between the holding roll 29a and a discharge port on an end portion of the die coater 30, in a state that the tension is imparted to the film-shaped mold 80a by the holding roll 29a. In order to stabilize the distance between the die coater 30 and a surface of the film-shaped mold 80a to be coated, it is desired to suppress the rotational deflection (rotational blur) of the holding roll 29a. In particular, it is desirable that the distance between the die coater 30 and the film-shaped mold 80a is maintained in a range of 10 μm to 500 μm. In FIG. 4, the direction in which the sol-gel material 41 is discharged from the discharge port at the end portion of the die coater 30 is parallel to the substrate transporting direction. However, the discharging direction of the sol-gel material 41 may be any direction or may have any orientation. Further, in FIG. 4, although the coating with the sol-gel material 41 is performed at a position at which the film-shaped mold 80a is vertical to the substrate transporting direction, the coating with the sol-gel material 41 can be performed on the film-shaped mold 80a in any orientation or at any position.

The optical substrate-producing apparatus 100 includes a control section (not depicted in the drawings) which comprehensively controls the operation of the entire apparatus and the respective operations of the substrate transporting section 130, the mold transporting section 140 provided with the pressing section 150 and the releasing section 160, and the coating section 120. The control section controls driving speeds of the substrate transporting section 130, the mold transporting section 140 and the pressing roll 22 so that, in particular, the substrate 40 transported by the substrate transporting section 130 is transported in synchronization with the film-shaped mold 80a transported by the mold transporting section 140 when passing through the pressing section 150. Further, the optical substrate-producing apparatus 100 may include an inspection device for observing the thickness and/or the state of the coating film formed by the coating section 120, an inspection device for observing the concave and convex pattern of the coating film after the releasing (peeling) of the film-shaped mold 80a, and the like.

An explanation will be given about an operation for processing the substrate 40 with the optical substrate-producing apparatus 100. In the substrate transporting section 130, the substrate 40 is transported (delivered) to the rotating rolls 36 on the upstream of the mold transporting section 140, and is transported to the pressing section 150, in particular, toward the pressing roll 22 provided on a predetermined position. On the other hand, in the mold transporting section 140, the film-shaped mold 80a is fed from the mold feeding roll 21, passes through the electricity removing device 142 arranged between the transporting rolls 29 and the electricity is removed from the film-shaped mold 80a; and then in the coating section 120, the sol-gel material 41 is applied to the film-shaped mold 80a by the die coater 30 while the long film-shaped mold 80a is being held by the holding roll 29a. With this, the film-shaped mold 80a is uniformly coated with the sol-gel material 41 in the width and length directions thereof so that the coating film made of the sol-gel material 41 has, for example, thickness in a range of 0.2 μm to 100 μm. Subsequently, the film-shaped mold 80a on which the coating film made of the sol-gel material 41 is formed reaches the pressing section 150 via the transporting roll 29. In the pressing section 150, the pressing roll 22 heated to a temperature in a range of the room temperature to 200 degrees Celsius presses the film-shaped mold 80a transported under the pressing roll 22 against the substrate 40 such that the film-shaped mold 80a overlaps with the substrate 40. Accordingly, the coating film 42 on the concave and convex pattern of the film-shaped mold 80a is pressed against the substrate 40 and is adhered to the substrate 40. Further, the gelation of the coating film 42 is caused to proceed by the heating with the pressing roll 22. Subsequently, the substrate 40 to which the coating film 42 has been adhered by the pressing roll 22 is transported to the releasing section 160 after passing through the heating furnace 28 in a state that the film-shaped mold 80a is remained to be pressed against the substrate 40. In the heating furnace 28, the substrate 40 is heated to a temperature in a range of the room temperature to 200 degrees Celsius in order to facilitate the peeling (releasing) of the film-shaped mold 80a from the coating film. In the releasing section 160, the film-shaped mold 80a is pulled upward to the mold take-up roll 24 via the transporting roll 29 when the film-shaped mold 80a passes through the peeling roll 23, thereby allowing the film-shaped mold 80a to be peeled off (released) from the coating film 42. Then, the electricity is removed from the film-shaped mold 80a by the electricity-removing unit 144 and the film-shaped mold 80a is taken up on the mold take-up roll 24 to be wound therearound. After the electricity is removed, by the electricity-removing unit 146, from the substrate 40 from which the film-shaped mold 80a has been peeled off, the substrate 40 is moved out of the optical substrate-producing apparatus 100. Accordingly, a substrate 40 having the coating film to which the concave-convex pattern of the film-shaped mold 80a has been transferred can be obtained. After this, the substrate 40 on which the pattern is formed is subjected to the main baking in an oven (not depicted in the drawings), etc. The oven for the main baking may be provided in the apparatus 100.

In the optical substrate-producing apparatus 100, it is possible to use any other driving means such as a movable table which moves while supporting the substrate, instead of the supporting roll 26. Further, although the peeling roll 23 is used so that the state in which the concave and convex pattern of the film-shaped mold 80a is pressed against the coating film 42 with the pressing roll 22 is maintained, it is allowable to use any other supporting member such as a plate-shaped member having a smooth surface and a corner with a curved surface, instead of the peeling roll 23, in order to maintain the above state. Note that the optical substrate-producing apparatus 100 as the second unit may include the roll process apparatus 70 as the first unit depicted in FIG. 2. For example, the roll process apparatus 70 as the first unit may be integrally incorporated in the optical substrate-producing apparatus 100 as the second unit so that the film take-up roll 87 of the roll process apparatus 70 may be used as it is, as the mold feeding roll 21 of the optical substrate-producing apparatus 100. In this case, it is allowable to provide a configuration wherein a rotating mechanism which drives the film take-up roll 87 is controlled by the control device of the optical substrate-producing apparatus 100 so as to switch the rotating direction. Alternatively, the optical substrate-producing apparatus 100 as the second unit may include the roll process apparatus 70 as the first unit, which is provided separately from the optical substrate-producing apparatus 100. In this case, the film take-up roll 87 around which the film-shaped mold 80a is wound in the roll process apparatus 70 is transported to a position at which the mold feeding roll 21 of the optical substrate-producing apparatus 100) is provided, and the film take-up roll 87 can be used as the mold feeding roll 21. The optical substrate-producing apparatus 100 may be separated from the roll process apparatus 70 as needed, and one of or both of the apparatuses 100 and 70 may be used at an suitable location or position.

In the following, an explanation will be given about modifications of the optical substrate-producing apparatus of the above-described embodiment.

[First Modification]

Figure 5:
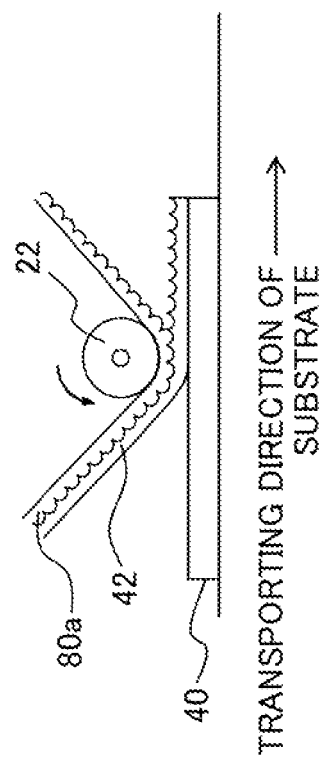
FIG. 5 is a conceptual view depicting a modification of an embodiment of the optical substrate-producing apparatus which does not use a releasing roll.

Although the peeling roll is provided on the optical substrate-producing apparatus 100 of the above-described embodiment, the peeling roll may be omitted as depicted in FIG. 5. In the apparatus depicted in FIG. 5, the film-shaped mold 80a fed from the mold feeding roll 21 (see FIG. 4) is pressed against the coating film 42 with a hot pressing roll 22, and then the film-shaped mold 80a is taken up or lifted with the mold take-up roll 24 (see FIG. 4) positioned above the substrate 40. By heating the pressing roll 22 and/or using any other heating means, the peeling (releasing) of the mold from the coating film immediately after the pressing is promoted and the pre-baking of the coating film can be performed.

[Second Modification]

Figure 6:
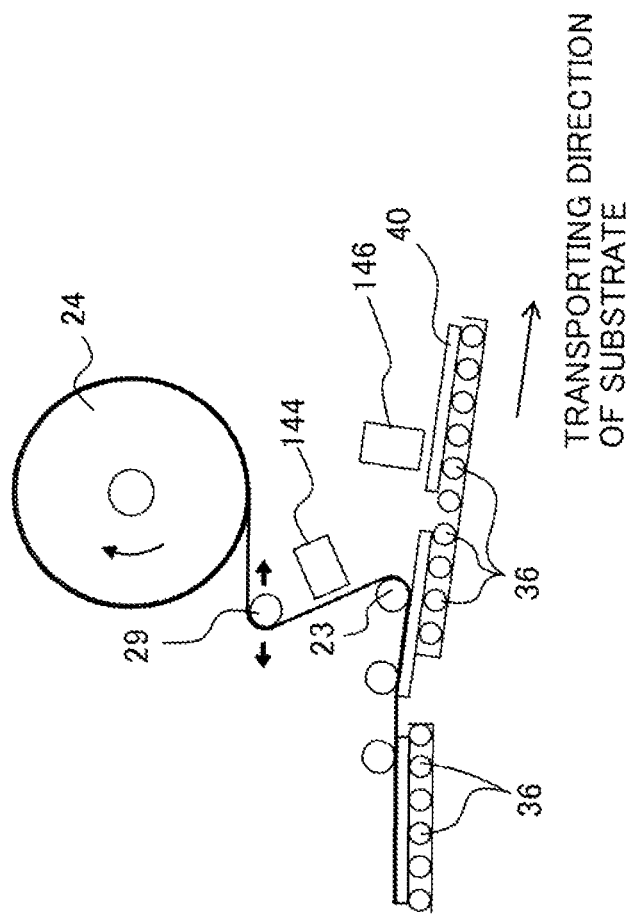
FIG. 6 is a conceptual view depicting a modification of the optical substrate-producing apparatus, in which the releasing direction (peeling-off-direction) of the film-shaped mold is made to be changeable (variable).

In the optical substrate-producing apparatus 100 of the above-described embodiment, it is allowable to appropriately change the peeling angle (releasing angle) at which the film-shaped mold 80a is peeled (released) from the coating film 42 so as to further facilitate the peeling (releasing) of the film-shaped mold 80a from the coating film 42. For example, as depicted in FIG. 6, the peeling angle of the film-shaped mold 80a can be changed by the following manner. Namely, at first, the height at which the rotating rolls 36 are arranged is changed, at the releasing section 160, from the height at which the rotating rolls are arranged in the upstream of the releasing section 160 so as to incline the transporting direction of the substrate 40; further, in the releasing section 160, the arrangement position of the peeling roll 23 is changed in accordance with the inclination in the transporting direction of the substrate 40 so that the releasing rolls 23, the film-shaped mold 80a and the substrate 40 make contact with one another, thereby making it possible to change the peeling angle of the film-shaped mold 80a. Alternatively, by changing the position of the transporting roll 29 in the transporting direction, for example, in a direction indicated by arrows in FIG. 6, the peeling angle can be adjusted as well.

[Third Modification]

Figure 7:
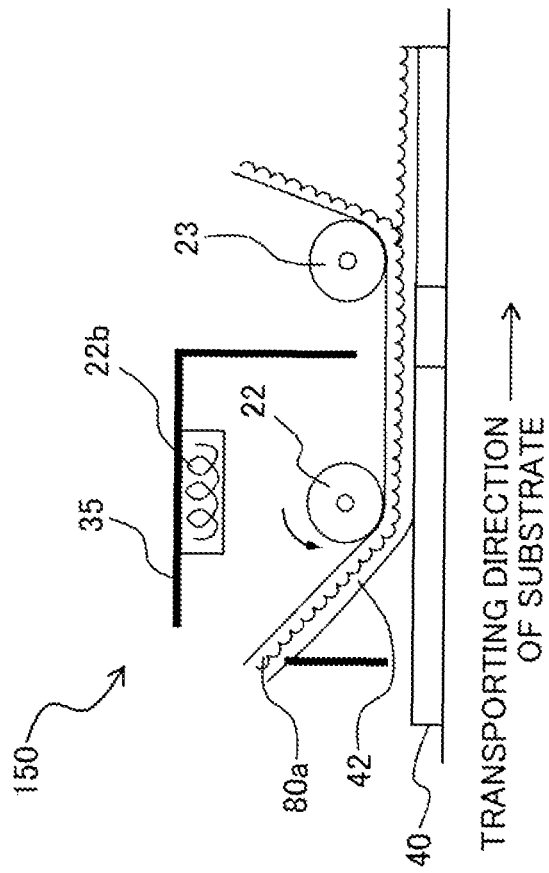
FIG. 7 is a conceptual view depicting a modification of the optical substrate-producing apparatus, in which a heat zone as a heating means for heating a sol-gel material layer is provided in a pressing section.

Although the heater 22a is provided inside the pressing roll 22 in the optical substrate-producing apparatus 100 of the above-described embodiment, it is allowable to adopt a configuration as depicted in FIG. 7, instead of the configuration having the heater for heating the pressing roll 22. As depicted in FIG. 7, a heater 22b may be provided inside a heat zone 35 arranged at the periphery of the pressing roll 22 of the pressing section 150, rather than providing the heater inside the pressing roll 22. Since the heater is provided in the heat zone 35, the inside of the heat zone 35 is maintained at a heating temperature. In this case, the coating film 42 is subjected to the pre-baking in the heat zone 35. Note that the heater may be provided not only inside the heat zone 35 but also inside the pressing roll 22 and/or inside the supporting roll 26. Further, it is also allowable to provide several pieces of heating rolls, each of which has a heater provided therein, so that the heating rolls face the supporting roll, instead of the configuration having the heat zone. Furthermore, in a case that a material in which the gel reaction occurs by being irradiated with a light is used as the sol-gel material for the coating film, a light irradiation zone may be provided, instead of the heat zone. As another modification of the installation of the heater, the heater 22a may be provided inside the supporting roll 26, rather than providing the heater 22a inside the pressing roll 22. In this case, the coating film 42 is subjected to the pre-baking by heat generated from the heater 22a provided inside the supporting roll 26. Alternatively, the heater 22a may be provided in the inside of both of the pressing roll 22 and of the supporting roll 26.

[Fourth Modification]

Figure 8:
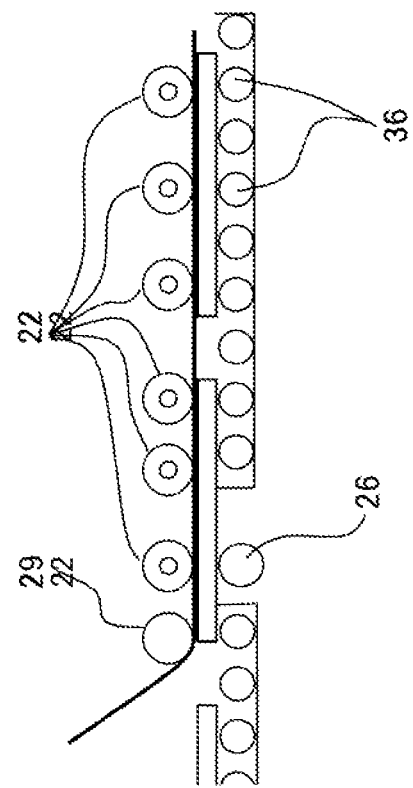
FIG. 8 is a conceptual view depicting a modification of the optical substrate-producing apparatus provided with a plurality of pressing rolls.

In the optical substrate-producing apparatus 100 of the above-described embodiment, one piece of the pressing roll 22 is provided. However, as depicted in FIG. 8, it is allowable that, on the downstream of the pressing roll 22 in the transporting direction, a plurality of pieces of the pressing roll 22 is further provided; and that the coating film 42 is pressed against the substrate 40 from the side opposite to the concave-convex pattern surface of the film-shaped mold 80a with these pressing rolls 22. In this case, the pressing forces of the pressing rolls 22 may be adjusted corresponding to the change in the hardness of the coating film. For example, the pressing force of the pressing rolls 22 may be adjusted in such a manner that the pressing force of the pressing rolls 22 is progressively increased from the upstream to the downstream in the transporting direction, in accordance with the hardness of the coating film becoming greater as proceeding further to the downstream.

[Fifth Modification]

Figure 9:
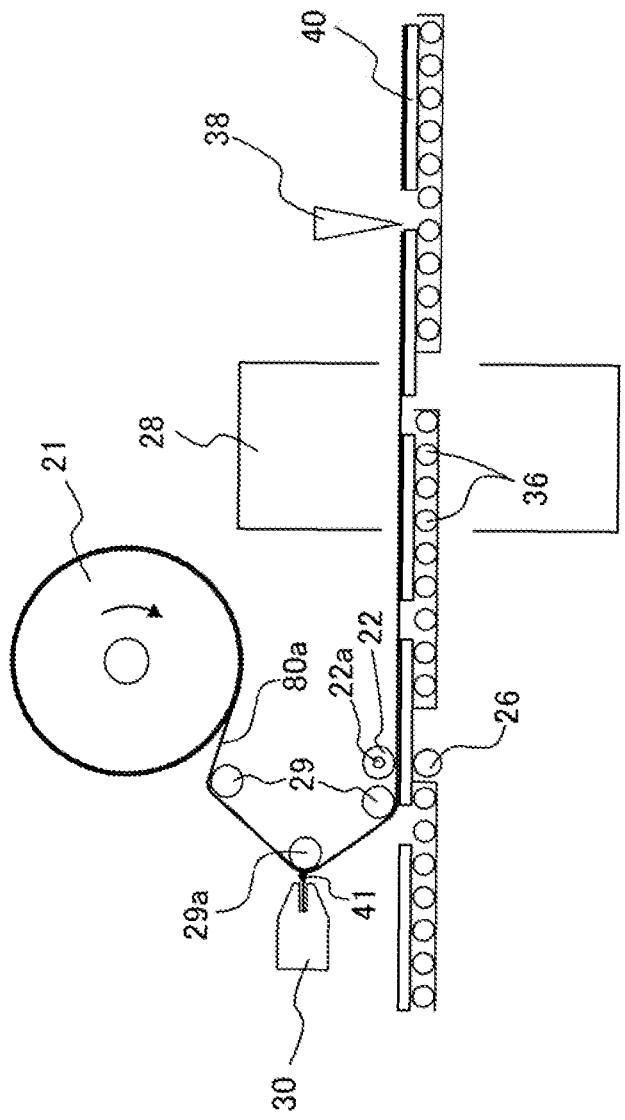
FIG. 9 is a conceptual view depicting a modification of the optical substrate-producing apparatus which cuts the film-shaped mold with a cutter, rather than releasing the film-shaped mold from a substrate.

In the optical substrate-producing apparatus 100 of the above-described embodiment, the peeling roll 23 and the mold take-up roll 24 are provided to peel (release) the film-shaped mold 80a off from the substrate 40 and the coating film 42 and to take up and wind the film-shaped mold 80a. It is allowable, however, that the peeling roll 23 and the mold take-up roll 24 are not provided, and that a cutter 38 is provided instead on the downstream of the heating furnace 28, as depicted in FIG. 9. In this modification, any peeling of the film-shaped mold 80a is not performed, rather, the cutter 38 is used to cut the film-shaped mold 80a along the edge portion of the substrate 40. In a case that an optical substrate provided with the film-shaped mold is produced as a product by this method, the film-shaped mold serves as a protective film of the substrate, thereby making it possible to prevent any foreign matter from adhering to the substrate during transportation, etc. Note that in this case, the main baking for the sol-gel material layer is to be performed after the film-shaped mold is peeled off from the sol-gel material layer of the optical substrate at a site to which the optical substrate has been transported.

[Sixth Modification]

Although the sol-gel material is cured by heat in the optical substrate-producing apparatus 100 of the above-described embodiment, a photo-curable sol-gel material may be used and the photo-curable sol-gel material may be cured by being irradiated with light. In this case, it is allowable that the heating roll 22a is not used. A light-radiating device may be provided, instead of the heating furnace 28.

The substrate, in which the pattern made of the sol-gel material layer is formed through the roll process as described above, can be used as, for example, a diffraction-grating substrate for organic EL element, a wire grid polarizer, an antireflection film, or an optical element for providing the light confinement effect in a solar cell by being placed on the photoelectric conversion surface side of the solar cell. Alternatively, the substrate having the above-described pattern may be used as a mold (mother die) so as to transfer the pattern to yet another resin. In this case, the transferred resin pattern is an inverted pattern of the pattern on the substrate. Thus, it is allowable to produce a mold as a replica of the substrate by transferring the transferred inverted pattern to yet another resin. Each of the molds can be subjected to an electroforming process using Ni, etc. so as to form a metallic mold. By using each of these molds, it is possible to mass-produce an optical part or component such as the diffraction-grating substrate for organic EL element.

[Method for Producing Organic EL Element]

Figure 10:
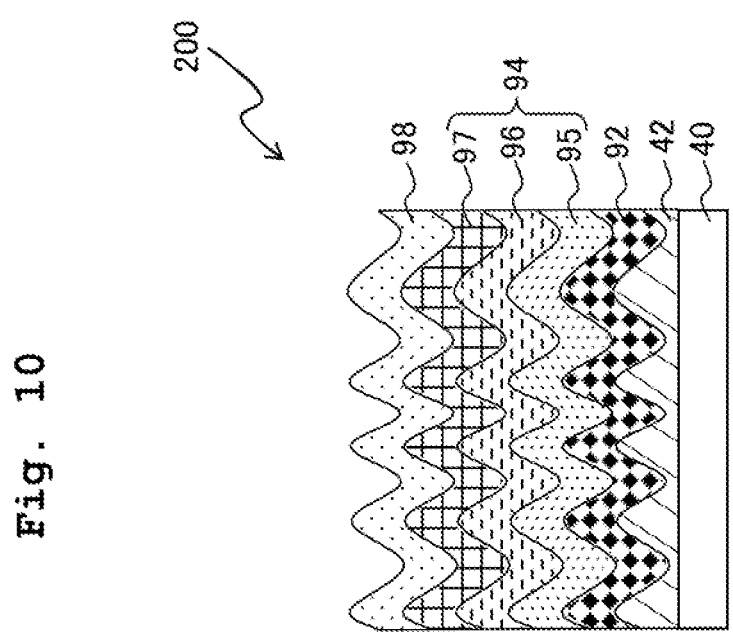
FIG. 10 is a view depicting the cross-sectional configuration of an organic EL element.

An explanation will be given about an example of a method for producing an organic EL element by using a substrate having a pattern made of a sol-gel material layer formed thereon, which is obtained through the roll process as described above, with reference to FIG. 10. At first, a substrate 40 having the pattern made of a sol-gel material layer 42 formed thereon is cleaned with a brush, etc., in order to remove any foreign matter adhered to the substrate, and then an organic matter, etc. is removed with an alkaline cleaning agent and an organic solvent. Next, as depicted in FIG. 10, a transparent electrode 92 is stacked on the sol-gel material layer 42 on the substrate 40 so as to maintain the concave-convex structure formed on the surface of the sol-gel material layer 42. Examples of those usable as the material for the transparent electrode 92 include indium oxide, zinc oxide, tin oxide, indium-tin oxide (ITO) which is a composite material thereof; gold; platinum, silver; copper, etc. Among these materials, ITO is preferable from the viewpoint of the transparency and the electrical conductivity. The thickness of the transparent electrode 92 is preferably within a range of 20 nm to 500 nm. In a case that the thickness is less than the lower limit, the electrical conductivity is more likely to be insufficient. In a case that the thickness exceeds the upper limit, there is possibility that the transparency is so insufficient that the emitted EL light cannot be extracted to the outside sufficiently. As the method for stacking the transparent electrode 92, it is possible to appropriately use any known method such as the evaporation method, sputtering method, spin coating method, etc. Among these methods, the sputtering method is preferably employed from the viewpoint of improving the adhesion property. Afterwards, the transparent electrode 92 is coated with photoresist, followed by being exposed with an electrode mask pattern. Then, etching is performed with a developing solution, thereby obtaining a transparent electrode having a predetermined pattern. Note that during the sputtering, the substrate is exposed to a high temperature of about 300 degrees Celsius. After cleaning the obtained transparent electrode with a brush and removing any organic matter, etc., with an alkaline cleaning agent and an organic solvent, an UV ozone treatment is preferably performed.

Next, an organic layer 94 as depicted in FIG. 10 is stacked on the transparent electrode 92. The organic layer 94 is not particularly limited, provided that the organic layer 94 is one usable as an organic layer of the organic EL element. As the organic layer 94, any known organic layer can be used as appropriate. Further, the organic layer 94 may be a stacked body of various organic thin films, and may be, for example, a stacked body of a hole transporting layer 95, a light emitting layer 96, and an electron transporting layer 97 as depicted in FIG. 10. Here, examples of the material of the hole transporting layer 95 include aromatic diamine compounds such as phthalocyanine derivatives, naphthalocyanine derivatives, porphyrin derivatives, N,N'-bis(3-methylphenyl)-(1,1'-biphenyl)-4,4'-diamine (TPD), and 4,4'-bis[N-(naphthyl)-N-phenyl-amino]biphenyl($\alpha$-NPD); oxazole; oxadiazole; triazole; imidazole; imidazolone; stilbene derivatives; pyrazoline derivatives; tetrahydroimidazole; polyarylalkane; butadiene; and 4,4',4''-tris(N-(3-methylphenyl)N-phenylamino)triphenylamine (m-MTDATA). The material of the hole transporting layer 95, however, is not limited to these.

Further, the light emitting layer 96 is provided so that a hole injected from the transparent electrode 92 and an electron injected from a metal electrode 98 are recombined to emit light. Examples of the material usable as the light emitting layer 96 include: metallo-organic complex such as anthracene, naphthalene, pyrene, tetracene, coronene, perylene, phthaloperylene, naphthaloperylene, diphenylbutadiene, tetraphenylbutadiene, coumarin, oxadiazole, bis-benzoxazoline, bisstyryl, cyclopentadiene, and aluminum-quinolinol complex (Alq3); tri-(p-terphenyl-4-yl)amine; 1-aryl-2,5-di(2-thienyl) pyrrole derivatives; pyran; quinacridone; rubren; distyrylbenzene derivatives; distyryl arylene derivatives; distyryl amine derivatives; and various fluorescent pigments or dyes. Furthermore, it is preferable that light-emitting materials selected from the above compounds are mixed as appropriate and then are used. Moreover, it is possible to suitably use a material system generating emission of light from a spin multiplet, such as a phosphorescence emitting material generating emission of phosphorescence, and a compound including, in a part of the molecules, a constituent portion formed by the above materials. Note that the phosphorescence emitting material preferably includes heavy metal such as iridium. A host material having high carrier mobility may be doped with each of the light-emitting materials as a guest material to generate the light emission using the dipole-dipole interaction (Foerster mechanism) or electron exchange interaction (Dexter mechanism). Examples of the material of the electron transporting layer 97 include heterocyclic tetracarboxylic anhydrides such as nitro-substituted fluorene derivatives, diphenylquinone derivatives, thiopyran dioxide derivatives, and naphthaleneperylene; and organometallic complex such as carbodiimide, fluorenylidene methane derivatives, anthraquino dimethane and anthrone derivatives, oxadiazole derivatives, and aluminum-quinolinol complex (Alq3). Further, in the above-described oxadiazole derivatives, it is also possible to use, as an electron transporting material, thiadiazole derivatives in which oxygen atoms of oxadiazole rings are substituted by sulfur atoms and quinoxaline derivatives having quinoxaline rings known as electron attractive group. Furthermore, it is also possible to use a polymeric material in which the above materials are introduced into a macromolecular chain or the above materials are made to be a main chain of the macromolecular chain. Note that the hole transporting layer 95 or the electron transporting layer 97 may also function as the light-emitting layer 96. In this case, the organic layer between the transparent electrode 92 and the metal electrode 98 is double-layered.

From the viewpoint of facilitating the electron injection from the metal electrode 98, a layer made of a metal fluoride or metal oxide such as lithium fluoride (LiF) or $Li_2O_3$, a highly active alkaline earth metal such as Ca, Ba, or Cs, an organic insulating material, or the like may be provided as an electron injection layer between the organic layer 94 and the metal electrode 98. Further, from the viewpoint of facilitating the hole injection from the transparent electrode 92, it is allowable to provide, as a hole injection layer between the organic layer 94 and the transparent electrode 92, a layer made of triazol derivatives, oxadiazole derivative, imidazole derivative, polyarylalkane derivatives, pyrazoline and pyrazolone derivatives, phenylenediamine derivative, arylamine derivatives, amino-substituted calcone derivatives, oxazole derivatives, styrylanthracene derivatives, fluorenone derivatives, hydrazone derivatives, stilbene derivatives, silazane derivatives, aniline-based copolymers, or electroconductive high-molecular oligomar, particularly thiophene oligomer.

Furthermore, in a case that the organic layer 94 is a stacked body formed of the hole transporting layer 95, the light emitting layer 96 and the electron transporting layer 97, the thicknesses of the hole transporting layer 95, the light emitting layer 96 and the electron transporting layer 97 are preferably within a range of 1 nm to 200 nm, a range of 5 nm to 100 nm, and a range of 5 nm to 200 nm, respectively. As the method for stacking the organic layer 94, any known method such as the vapor deposition method, sputtering method, spin coating method and die coating method can be employed as appropriate.

In the step for forming the organic EL element, subsequently, a metal electrode 98 is stacked on the organic layer 94, as depicted in FIG. 10. Materials of the metal electrode 98 are not particularly limited, and a substance having a small work function can be used as appropriate. Examples of the materials include aluminum, MgAg, MgIn, and AlLi. The thickness of the metal electrode 98 is preferably within a range of 50 nm to 500 nm. In a case that the thickness is less than the lower limit, the electrical conductivity is more likely to be decreased. In a case that the thickness exceeds the upper limit, there is such a possibility that the repair might be difficult to perform when any short circuit occurs between the electrodes. Any known method such as the vapor deposition method, sputtering method, etc. can be adopted to stack the metal electrode 98. Accordingly, an organic EL element 200 having a structure as depicted in FIG. 10 can be obtained.

As described above, since the concave-convex pattern of the optical substrate produced in accordance with the method of the present invention is made of the sol-gel material, the optical substrate is advantageous in the following points as compared with a substrate having a concave-convex pattern formed of a curable resin. Namely, since the sol-gel material has excellent mechanical strength, any flaw or scratch, adhesion of any foreign matter, generation of any projected portion on the transparent electrode during the production process of the organic EL element are less likely to occur even in a case that the cleaning with a brush is performed for the surface formed with the concave-convex pattern after the formation of the substrate and the transparent electrode, thereby making it possible to suppress any failure of the element which would be otherwise caused by the flaw, foreign matter, projected portion, etc. Therefore, the organic EL element obtained by the method of the present invention is more superior to that obtained by using the substrate made of the curable resin, in view of the mechanical strength of the substrate having the concave-convex pattern.

Further, the substrate formed of the sol-gel material produced in accordance with the method of the present invention has excellent chemical resistance, and thus has a relatively high corrosion resistance against the alkaline solution, the organic solvent, etc. used in the cleaning step of the substrate and the transparent electrode, thereby making it possible to use a variety of kinds of cleaning solutions. Further, the alkaline developing solution is used during the patterning of the transparent substrate in some cases as described above, and the substrate formed of the sol-gel material has also chemical resistance against such a developing solution. In this respect, the substrate formed of the sol-gel material is advantageous as compared with the substrate formed of the curable resin of which chemical resistance to the alkaline solution is relatively low.

Furthermore, the substrate formed of the sol-gel material produced in accordance with the method of the present invention has excellent heat resistance. Therefore, the substrate formed of the sol-gel material can withstand a high temperature environment of the sputtering step in the process of forming the transparent electrode for the organic EL element. Further, the substrate formed of the sol-gel material produced in accordance with the method of the present invention has UV resistance and weather resistance superior to those of the substrate made of the curable resin, and thus also has the resistance against the UV ozone cleaning treatment performed after the formation of transparent electrode.

In a case that the organic EL element produced by the method of the present invention is used outdoors, any degradation due to the sunlight can be suppressed more than in a case that an organic EL element produced by using the substrate having the concave-convex pattern formed in the curable resin is used. Further, any long term use of the organic EL element using the resin substrate is difficult because the curable resin as described above might be degraded to generate any yellowing, any gas, etc. in a case that the curable resin is left under a high temperature environment for a long period of time due to the heat generation associated with the light emission. In contrast, such degradation is suppressed in the organic EL element provided with the substrate made of the sol-gel material.

A modification of the method for producing the organic EL element of the above-described embodiment will be explained with reference to FIG. 11. In the embodiment, the transparent electrode, the organic layer and the metal electrode are successively stacked on the sol-gel material layer (on the surfaces of the concavities and convexities) of the optical substrate produced through the roll process so as to produce the organic EL element. It is allowable, however, to stack a transparent electrode 92a, an organic layer 94a and a metal electrode 98a successively on a surface (flat surface), of an optical substrate, on the side opposite to the concave-convex surface of the optical substrate, so as to produce an organic EL element 200a as depicted in FIG. 11. In this modification, the transparent electrode, the organic layer and the metal electrode can be stacked by using the same method and the same material as those explained in the above-described embodiment. The transparent electrode 92a, the organic layer 94a and the metal electrode 98a of the organic EL element 200a produced by the producing method of the modification are stacked on the flat surface which has no concave-convex pattern, on the opposite side to the surface on which the sol-gel material layer 42 having the concave-convex pattern is formed thereon. Accordingly, each of the transparent electrode 92a, the organic layer 94a and the metal electrode 98a has a flat layer structure. Further, in the organic EL element 200a produced by the producing method of the modification, the sol-gel material layer 42 can function as a micro lens array which suppress the total reflection of a light passing through the optical substrate at the interface between the substrate (including the sol-gel material layer 42) and the air, thereby improving the light extraction efficiency.

The optical substrate which is used in the organic EL element-producing methods of the embodiment and the modification as described above has the concave-convex pattern only on one surface of the optical substrate. It is allowable, however, that an optical substrate having the concave-convex pattern formed on the both surfaces thereof is used to produce an organic EL element. By doing so, it is possible to produce an organic EL element provided with both of a concave-convex pattern as the diffraction grating and another concave-convex pattern as the micro lens array. The optical substrate including the concave-convex patterns on the both surfaces thereof can be produced by forming a concave-convex pattern made of the sol-gel material on one surface of the optical substrate by the above-described method for producing optical substrate, and then by forming a concave-convex pattern on the other surface, of the optical substrate, on the opposite side to the surface on which the concave-convex pattern surface has been formed, while adopting the above-described method for producing optical substrate. It is allowable to form only the concave-convex pattern on one surface with the above-described method for producing optical substrate, and to form the concave-convex pattern on the other surface with any other method.

Although the present invention has been explained as above with the embodiment, the optical substrate-producing method and the optical substrate-producing apparatus of the present invention are not limited to the above-described embodiment, and may be appropriately modified or changed within the range of the technical ideas described in the following claims. For example, the optical substrate-producing apparatus depicted in FIG. 4 may be provided with a drying mechanism which dries the coating film and which is provided between the coating section (coating film-forming section) 120 and the pressing section 150.

The optical substrate-producing method and the optical substrate-producing apparatus of the present invention are capable of producing an optical substrate with high throughput while performing the minute pattern transfer accurately and reliably. The concave-convex pattern of the optical substrate produced by the producing method and the producing apparatus according to the present invention is excellent in the heat resistance, the weather resistance and the corrosion resistance. Further, the concave-convex pattern of the optical substrate is also resistant to the producing process of an element in which the optical substrate is incorporated, which also makes it possible to extend the service life of the element. Thus, the optical substrate obtained by the producing method and the producing apparatus according to the present invention is quite effective for a variety of kinds of devices such as organic EL elements, solar cells, etc., and the variety of kinds of devices such as organic EL elements, solar cells, etc., which are excellent in the heat resistance, weather resistance and corrosion resistance can be produced by using the optical substrate obtained in this manner.

What is claimed is:

1. A method for producing an optical substrate, the method comprising:
   a step of preparing a film mold having a concave-convex pattern surface having a concave-convex pattern;
   a step of forming a coating film made of a sol-gel material on the concave-convex pattern surface of the film mold;
   a step of adhering the coating film, which is formed on the concave-convex pattern surface of the film mold, to a substrate by arranging the concave-convex pattern surface of the film mold on which the coating film made of the sol-gel material is formed to face the substrate and by pressing a pressing roll against a surface of the film mold on a side opposite to the concave-convex pattern surface;
   a step of releasing the film mold from the coating film; and
   a step of curing the coating film adhered to the substrate.

2. The method for producing the optical substrate according to claim 1, wherein the step of preparing the film mold includes:
   coating a film-base member with a concave-convex forming material;
   performing a roll transfer of the concave-convex pattern to the concave-convex forming material by pressing a transfer roll having the concave-convex pattern against the concave-convex forming material with which the film-base member has been coated, while rotating the transfer roll; and
   curing the concave-convex forming material, to which the concave-convex pattern has been transferred by the roll transfer, so as to obtain the film mold in a roll shape.

3. The method for producing the optical substrate according to claim 2, wherein the film-base member having the cured concave-convex forming material is taken up by a film take-up roll to be wound around the film take-up roll.

4. The method for producing the optical substrate according to claim 2, wherein the concave-convex pattern of the transfer roll is transferred while the film-base member is being transported by using a film feeding roll configured to feed the film-base member and a film take-up roll configured to take up the film-base member to wind the film-base member therearound.

5. The method for producing the optical substrate according to claim 3, wherein the film mold in the roll shape wound around the film take-up roll is fed to and is moved toward the pressing roll.

6. The method for producing the optical substrate according to claim 5, wherein the released film mold is taken up by a mold take-up roll to be wound around the mold take-up roll.

7. The method for producing the optical substrate according to claim 1, wherein the pressing roll is pressed against the surface of the film mold on the side opposite to the concave-convex pattern surface while the coating film formed on the concave-convex pattern surface is being heated.

8. The method for producing the optical substrate according to claim 1, wherein the coating film is heated between the step of adhering the coating film to the substrate and the step of releasing the film mold from the coating film, or in the step of releasing the film mold from the coating film.

9. The method for producing the optical substrate according to claim 1, wherein the film mold is fed underneath the pressing roll while the film mold is being continuously coated with the sol-gel material, and a plurality of pieces of the substrate are transported to the pressing roll and the coating film formed on the concave-convex pattern surface of the film mold is pressed successively against the plurality of substrates with the pressing roll.

10. The method for producing the optical substrate according to claim 1, wherein the concave-convex pattern of the film mold is an irregular concave-convex pattern;
   an average pitch of concavities and convexities of the irregular concave-convex pattern is in a range of 100 nm to 1,500 nm; and
   an average value of depth distribution of the concavities and convexities is in a range of 20 nm to 200 nm.

11. The method for producing the optical substrate according to claim 1, wherein the substrate is a glass substrate.

12. The method for producing the optical substrate according to claim 1, wherein the sol-gel material contains a silica precursor.

13. A method for producing an organic EL element, the method comprising:
   producing a diffraction grating substrate, which has a concave-convex surface as an optical substrate, by using the method of producing the optical substrate as defined in claim 1; and
   stacking a transparent electrode, an organic layer, and a metal electrode successively on the concave-convex surface of the diffraction grating substrate, so as to produce the organic EL element.

* * * * *